(12) United States Patent  (10) Patent No.: US 7,506,436 B2
Bachman  (45) Date of Patent: Mar. 24, 2009

(54) METHODS FOR MAKING CONFORMING SHIELDED FORM FOR ELECTRONIC COMPONENT ASSEMBLIES

(75) Inventor: Bruce Bachman, Bonita, CA (US)

(73) Assignee: Spraylat Corporation, Pelham, NY (US)

( * ) Notice: Subject to any disclaimer, the term of this patent is extended or adjusted under 35 U.S.C. 154(b) by 346 days.

(21) Appl. No.: 11/229,141

(22) Filed: Sep. 16, 2005

(65) Prior Publication Data

US 2006/0012969 A1    Jan. 19, 2006

Related U.S. Application Data

(62) Division of application No. 10/198,589, filed on Jul. 18, 2002, now Pat. No. 7,013,558, and a division of application No. 09/531,745, filed on Mar. 21, 2000, now Pat. No. 6,483,719.

(51) Int. Cl.
  *H05K 3/34* (2006.01)
  *H05K 3/30* (2006.01)
  *H01R 43/00* (2006.01)
(52) U.S. Cl. .............................. 29/840; 29/841; 29/855
(58) Field of Classification Search .................. 29/825, 29/832, 846
  See application file for complete search history.

(56) References Cited

U.S. PATENT DOCUMENTS

| | | | | | |
|---|---|---|---|---|---|
| 4,227,037 | A | * | 10/1980 | Layton | 174/386 |
| 4,469,658 | A | * | 9/1984 | Kimura et al. | 419/7 |
| 4,678,716 | A | * | 7/1987 | Tzeng | 428/551 |
| 4,739,453 | A | * | 4/1988 | Kurokawa | 361/816 |
| 5,811,050 | A | * | 9/1998 | Gabower | 264/299 |
| 6,013,203 | A | * | 1/2000 | Paneccasio et al. | 252/512 |
| 6,375,866 | B1 | * | 4/2002 | Paneccasio et al. | 252/511 |
| 6,624,432 | B1 | * | 9/2003 | Gabower et al. | 250/515.1 |
| 7,013,558 | B2 | * | 3/2006 | Bachman | 29/832 |

* cited by examiner

*Primary Examiner*—David P Bryant
*Assistant Examiner*—David P Angwin
(74) *Attorney, Agent, or Firm*—Richard R. Muccino

(57) ABSTRACT

The present invention provides a method for preparing a conforming shield enclosure for shielding a semiconductor device of an electronic component assembly comprising the steps of: (a) metalizing a sheet of a thermoformable polymer with an admixture of a conductive metal and a resin; and (b) thermoforming the metalized thermoformable polymer from step (a) to form a conforming shield enclosure; wherein the conforming shield enclosure has dimensions conforming to the inside of a housing of the electronic component assembly and enclosing and thereby shielding the semiconductor device from electromagnetic frequencies, wherein the conforming shield enclosure is prepared by paint metalization.

18 Claims, 10 Drawing Sheets

METHODS FOR MAKING CONFORMING SHIELDED FORM FOR ELECTRONIC COMPONENT ASSEMBLIES

This application is a divisional application of parent application Ser. No. 09/531,745, filed 21 Mar. 2000, becoming U.S. Pat. No. 6,483,719, and application Ser. No. 10/198,589, filed 18 Jul. 2002, becoming U.S. Pat. No. 7,013,558.

FIELD OF THE INVENTION

The present invention is directed to electronic components shielded from electromagnetic interference through the use of conforming shield enclosures. Conforming shield enclosures are flexible metalized thermoformed thin-wall polycarbonate polymer film substrates used to shield a radiation source. The present invention relates to conforming shielded forms for electronic component assemblies and specifically to electronic component assemblies which are shielded to protect against electromagnetic and radio frequency interference. Specifically, the shielded electronic component assembly comprises (a) a semiconductor device to be shielded from electromagnetic frequencies; (b) a reference potential source; (c) a housing enclosing the semiconductor device within the assembly; and (d) a conforming shield enclosure electrically connected to the reference potential source. The conforming shield enclosure comprises a flexible, metalized thermoformable polymer having dimensions conforming to the inside of the housing and enclosing and thereby shielding the semiconductor device from electromagnetic frequencies. The conforming shield enclosure is prepared by paint metalization.

DESCRIPTION OF THE BACKGROUND

Propagating electrical signals have an electrical field component and a magnetic field component. Electrical signals cause circuit components to radiate a portion of the spectral energy of the propagating signal causing electromagnetic interference. Electromagnetic interference is the generation of undesired electrical signals in electronic system circuitry because of the unintentional coupling of impinging electromagnetic field energy. Circuit elements are effective in radiating spectral components which have wavelengths similar to the radiating element dimensions. Long circuit elements will be more effective in radiating low frequency noise and short circuit elements will be more effective in radiating high frequency noise. These circuit elements behave like antennae which are designed for the transmission of the radiating wavelengths.

Integrated circuits which have output drivers that create pulses with high amounts of spectral energy are more likely than low power drivers to cause electromagnetic interference because of a mismatch between the driver and the line impedance, and the resistance to instantaneous signal propagation imposed by the parasitics of the conductor. These disturbances in the electromagnetic field result in reflections of the signal energy at the points where the variation occurred. If the signal is not absorbed by the load at the end of the conductor length because of unmatched impedances or lack of line termination, the unabsorbed energy will be reflected back towards the source giving rise to radiated emissions. Proper termination and controlled impedance interconnections can reduce radiated noise.

The coupling of signal energy from an active signal net onto another signal net is called crosstalk. Crosstalk is within-system electromagnetic interference as opposed to electromagnetic interference from a distant source. Crosstalk is proportional to the length of the net parallelism and the characteristic impedance level, and inversely proportional to the spacing between signal nets. Proper interconnect layout design can reduce the incidence of crosstalk. Strong sources of low impedance, magnetic field rich electromagnetic interference are relatively high current and relatively low voltage components. Magnetic fields possessing high intensity can induce spurious current flow in other system components. Noise radiated from within a system can interfere with system performance by coupling with other system elements, not just adjacent conductor nets, as another form of within system electromagnetic interference.

Because electronic systems are becoming smaller and the density of electrical components increasing, the dimensions of the average circuit element is decreasing favoring the radiation of higher frequency signals. The increasing operating frequency in these electrical systems results in increasing high frequency electromagnetic interference. Electromagnetic interference can come from electrical systems distant from a receiving circuit, or the source of the noise can come from a circuit within the same system (crosstalk or near source radiated emission coupling). The effect of all these sources of noise is to degrade the performance or to induce errors in the systems. The prevalence of high frequency systems and portable electronics is creating a very complex spectral environment for the operation of sensitive electrical systems.

The electromagnetic interference shielding of electronic component assemblies has taken many forms. Sensitive or radiating devices may be covered with a lid and/or enclosure which is connected to ground potential in the process of securing the cover in place. Shielding close to the source, where the field intensity is the highest, requires greater shield efficiency to contain the field. It is common to shield the sensitive, electromagnetic interference receiving component or even the entire circuit board. Polymer thick film conductor materials, such as a screen-printable copper filled epoxy paste, are sometimes used to form a shield. Individual ferrite components may be placed on device pins or in series within a circuit to attenuate unwanted noise. A ferrite component may be used with a capacitor in order to form a low frequency inductance-capacitance band pass filter. Many enclosed systems powered by external alternating current are shielded from electromagnetic interference by the incorporation of internal shields which are connected to ground potential. A metal cabinet housing which encloses the system may be designed to function as a shield. Disadvantages of metal housings are that they are often expensive, heavy, and difficult to make in complex shapes. The inside of a molded plastic housing may be coated with a thin metal film through vacuum metalization but this process often yields a brittle less flexible shield. Another method is to coat the enclosure with a thin film of a conductor using a metal-filled paint. A metal-filled plastic may also be used to form the housing.

U.S. Pat. No. 4,012,089 (Ward) discloses an electronic instrument enclosure using a molded, laminated plastic enclosure having an outer shell made of a thermoplastic composition which has desirable physical and electrical characteristics (see FIG. 1). An inner plastic shell is nested in the outer shell with a stiffening filler material sandwiched between. Heat pipes may be imbedded in the shells to provide cooling for the enclosed electrical components and inserts for the mounting of slides and guidepins can be molded in the inner shell for ease in mounting hardware for slidable drawers. The inside walls of the inner shell may be vacuum metalized or plated to provide radio frequency shielding.

U.S. Pat. No. 4,227,037 (Layton) discloses a container having complementary upper and lower portions (see FIG. 1). Each portion is adapted to mate with and engage to define an enclosed inner chamber. The upper and lower portions each have laminated outer casings. A non-metallic, electrically conductive, inner layer is integrally molded with and bonded between the outer non-metallic reinforcing layers to shield the inner chamber from electromagnetic and radio frequency interference.

U.S. Pat. No. 4,678,716 (Tzeng) discloses an electrically conductive particle for use as a conductive filler in a resin matrix suitable for electromagnetic shielding use in gaskets (see FIG. 1). The particle comprises an inner core of an aluminum silicon alloy having from 5% to 20% by weight of silicon, an intermediate layer of a metal selected from the group consisting of mercury, palladium, copper, chromium, platinum, gold, nickel, tin, and zinc, and an outer layer of a highly electrically conductive metal.

U.S. Pat. No. 4,739,453 (Kurokawa) discloses a shielding apparatus for shielding electric circuitry mounted on a printed circuit board against interfering electric waves (see FIG. 1). The shielding apparatus comprises a multi-layer printed circuit board having a circuit trace printed on a middle layer. A first circuitry block is mounted on an outer surface of the multi-layer printed circuit board and is electrically connected to the circuit trace so that the first circuitry block is connected to one other circuitry block mounted on the multi-layer printed circuit board via the circuit trace. A metallic plate covers the first circuitry block to isolate the first circuitry block from the other circuitry block.

U.S. Pat. No. 4,831,498 (Baba) discloses a shield structure which is mounted on a circuit board. The shield structure comprises conductive pattern members, conductive box members, rib means, screw-fastening means, and conductive through-holes. A first conductive pattern member is formed on a top surface and a second conductive pattern member is formed on a bottom surface of the circuit board. The first conductive pattern member is formed along a shield-requiring region on the top surface of the circuit board and the second conductive pattern member is formed along a shield-requiring region on the bottom surface of the circuit board. A first conductive box member has an open side and defines a shielded space enclosing the shield-requiring region on the top surface of the circuit board. A second conductive box member has an open side and defines a shielded space enclosing the shield-requiring region on the bottom surface of the circuit board. A first conductive rib means is formed on an edge defining the open side of the first conductive box member and is connected to the first conductive pattern member. A second conductive rib means is formed on an edge defining the open side of the second conductive box member and is connected to the second conductive pattern member. A screw-fastening means secures the first conductive box member and the second conductive box member in pressure contact with the circuit board and for causing the first conductive rib means to bite into the first conductive pattern member and for causing the second conductive rib means to bite into the second conductive pattern member. Conductive through-holes are provided with conductive linings formed on the top surface and bottom surface of the circuit board and are electrically connected to the first conductive pattern member and the second conductive pattern member.

U.S. Pat. No. 4,857,668 (Buonanno '668) discloses a multi-function gasket for electrical apparatus which generate or are adversely affected by electromagnetic and radio frequency interference (EMI/RFI). The multi-function gasket comprises a continuous, molded, resilient foam core having a sealed outer boundary layer. A flexible, electrically conductive and substantially abrasion resistant sheath externally surrounds the foam core and bonds to the boundary layer. The foam fills the interior of the sheath. A means for mounting the gasket is provided whereby an apparatus may be sealed against EMI/RFI leakage, noise emission and environmental infiltration through perimeter gaps of electrically conductive doors, access panels by the actions and interactions of the sheath, the foam core and the boundary layer. The flexible sheath is continuously pressed by the resilient foam core into positive engagement with conducive surfaces between which the gasket may be mounted forming a continuous electrical path enclosing the foam core extending continuously across the gaps and preventing EMI/RFI leakage through the gaps. The boundary layer prevents noise emission and environmental infiltration across the gaps and the sheath protects the boundary layer against damage from abrasion.

U.S. Pat. No. 4,967,315 (Schelhorn) discloses a shielded RF package having a ceramic seal ring and a ceramic circuit supporting substrate positioned between metallic base and lid elements. The ceramic elements are metallized over portions of three of their surfaces to permit conductive continuity between the seal ring, the substrate, and the metallic lid and base of the package providing integral shielding and ground for the microwave components mounted in the package. The surface metallization of the ceramic components is patterned to produce electrical isolation at the input/output ports of the package, but provide an integral ground connection between the package lid and the metallic package base. The shielded RF package comprises a ceramic circuit board substrate having an edge and broad flat upper and lower surfaces for supporting electrical components above the flat upper surface. The substrate includes metallization traces on the upper surface for defining interconnections of the components. The traces extend to a region near the edge for defining an input or an output conductor. The substrate is metallized on the upper surface around the periphery near the edge except in an open region adjacent the input and output conductor to form an upper ground conductor. The substrate is also metallized around the periphery of the broad lower surface near the edge to define a lower conductor. The substrate is also metallized on the edge for interconnecting the upper ground conductor and the lower conductor. A ceramic seal ring defines horizontal upper and lower surfaces and inner and outer vertical surfaces. The seal ring is metallized on the horizontal upper surface and on the outer vertical surface. The seal ring is also metallized on the horizontal lower surface except in an open region to form a continuous conductive path between the metallization on the horizontal upper and lower surfaces of the seal ring by way of the metallization on the outer vertical surface. The seal ring is mounted upon the substrate with the unmetallized open regions of the substrate and ring in registry and with the metallization on the horizontal lower surface of the seal ring in electrical contact with the metallization on the upper surface around the principal portion of the periphery. The seal ring is sealed in place with glass material in the unmetallized regions. A metallic lid is supported by the metallization of the horizontal upper surface of the seal ring and sealed thereto by a first reflowed metal preform. A metallic base supports the ceramic circuit board substrate and is sealed to the periphery of the metallized portion of the lower surface of the ceramic circuit board substrate by a second metal preform.

U.S. Pat. No. 5,107,404 (Tam) discloses a circuit board assembly for a cellular telephone system. The circuit board assembly comprises a printed circuit board having multiple layers including an interior ground plane and an interior signal plane and having a number of electronic components and a number of ground plane lines and a number of signal plane lines on an outer surface which is opposite the electronic components. The ground plane is interrupted in defined regions to permit the signal plane lines to tunnel underneath the ground plane lines. The printed circuit board has a number of holes which are plated through to interconnect the interior ground plane with the ground plane lines. The circuit board assembly has a housing for enclosing the printed circuit board. The housing comprises a frame having an outer wall surrounding the periphery of the printed circuit board and defining an interior space. The frame includes a number of interior walls spanning the interior space and mounting means mounting the printed circuit board to the frame to span the interior space defined by the frame. The ground plane lines on the printed circuit board are in alignment with and electrically engage the adjacent edge of the interior walls of the frame. The housing comprises first and second cover plates spanning the interior space defined by the outer wall of the frame on opposite sides of the printed circuit board to enclose the printed circuit board within a housing chamber defined by the outer wall of the frame and the first and second cover plates. One of the cover plates has interiorly extending walls corresponding to and in alignment with the interior walls of the frame on the opposite side of the printed circuit board and electrically engaging the ground plane lines on the printed circuit board. The interior walls form a number of sub-chambers within the housing chamber. The sub-chambers are arranged to isolate respective ones of the electronic components on the printed circuit board. Securing means directly connect the first and second cover plates to each other independently of the printed circuit board and the frame such that the first and second cover plates are pressed against the frame to secure the frame between the first and second cover plates.

U.S. Pat. No. 5,202,536 (Buonanno '536) discloses a seal for blocking propagation of electromagnetic energy through a gap between bodies having conductive surfaces adjacent the gap. The seal comprises an elongated core element defining a resiliently compressible cross section. A flexible elongated conductive sheath portion is attached to the core element at a surface of the core element exposed to the conductive surfaces of the bodies. The conductive sheath portion extends part way around the cross section and defining ends which are spaced on the core element and non-overlapping. One additional flexible and elongated sheath portion is attached to the core element and extends between the ends of the conductive sheath portions. The conductive sheath portion and the additional sheath portion together extend fully around the cross section of the core element. The conductive sheath portion defines a conductive exterior surface of the seal extending around a first part of the cross section of the seal and the additional sheath portion defining a nonconductive exterior surface of the seal extending around a second part of the cross section of the seal. The additional sheath portion is lapped with one of the spaced, non-overlapping ends of the conductive sheath portion. The conductive sheath portion and the additional sheath portion respectively define electromagnetic and environmental barriers bridging across the gap.

U.S. Pat. No. 5,548,121 (Balmer et al.) discloses an electronically shielded solid state charged particle detector system. The shielded solid state charged particle detector system comprises a conductive detector housing having a detector entrance window for receiving charged particles. A charged particle detector has an active surface disposed within the conductive detector housing, the active surface facing the detector entrance window for providing electrical signals representative of the received charged particles when the received charged particles are applied to the active surface. A conductive layer is disposed upon the active surface and is electrically coupled to the conductive detector housing to provide a continuous conductive electrical shield surrounding the active surface.

U.S. Pat. No. 5,566,055 (Salvi, Jr.) discloses an EMI/RFI shielded cover assembly for an electronics enclosure. The cover assembly comprises a cover plate having a major surface area and interface locations for sealing against the electronics enclosure. A shielding compound is disposed in a layer across the major surface area and the interface locations on the cover plate. The shielding compound provides EMI/RFI shielding for the major surface area, and resilient gasket-like response at the interface locations to enable the cover assembly to be sealed to the electronics enclosure.

U.S. Pat. No. 5,594,200 (Ramsey) discloses an electromagnetic isolation chamber containing a volume of space electromagnetically isolated from the surrounding environment. The electromagnetic isolation chamber comprises a wall enclosing the volume, the wall having first electromagnetic shielding surrounding the volume and having an aperture wherein the first shielding is disrupted. A flexible, conductive second electromagnetic shielding is disposed within the chamber and covers the aperture in the wall and is conductively and shieldingly attached to the first electromagnetic shielding of the wall around the periphery of the aperture. The second shielding is deformable and of sufficient size to enclose objects which may be inserted into the chamber through the aperture and to permit tactile feel and manipulation of the objects within the chamber so that continuity of electromagnetic isolation of the volume is maintained through the insertion.

U.S. Pat. No. 5,712,449 (Miska et al.) discloses a gasket for blocking electromagnetic radiation between two electrically conductive bodies. The gasket comprises a compressible core generally shaped as a sheet extending along part of the length and width of the body. An electrically conductive surface material is disposed on opposite faces of the core for bearing against the conductive bodies. A number of electrically conductive connections at spaced positions electrically couples between the electrically conductive surface material on the opposite faces.

U.S. Pat. No. 5,717,577 (Mendolia et al.) discloses an apparatus for shielding electromagnetic emissions created by electronic components and circuitry. The apparatus comprises a printed circuit board for mounting the electronic components. The printed circuit board includes a ground plane and a ground pad ring located on a top surface of the printed circuit board surrounding the electronic components. A means for electrically connecting the ground pad ring to the ground plane is provided. A shield can has a lip extending along a perimeter which is aligned with the ground pad ring. A gasket is constructed of a semi-lossy conductive material positioned between the lip along the perimeter of the shield can and the ground pad ring to provide a conductive seal and to attenuate electromagnetic emissions within the shield can.

U.S. Pat. No. 5,748,455 (Phillips et al.) discloses an electromagnetic shield for shielding an electrical circuit on a circuit board which is a conductive strip extending around the electrical circuit. The electromagnetic shield comprises a face, a side wall extending around the face, and a series of spring contacts extending from the side wall for electrical contact with the conductive strip extending around the circuit board. The spring contacts are flexible and movable up and down relative to the face of the shield and form an integral one-piece construction with the side wall. Each spring contact includes a first tab that projects from the plane of the sidewall and a finger that extends from the first tab and flexes about a fold line extending between the first tab and the finger. The shield is installed between the circuit board and a housing. The respective first tabs project outwardly from the sidewall and include upper edges that are engaged by the housing causing the shield to be pressed towards the circuit board where the spring contacts engage the conductive strip.

U.S. Pat. No. 5,763,824 (King et al.) discloses a shielding cover in combination with an electrical assembly. The electrical assembly has an electrical ground, an electronic component electrically connected to the assembly, and a conductive frame which is disposed about the electronic component and which is electrically connected to the ground. The conductive frame has a mounting surface. The shielding cover comprises a lid and an electrically conductive adhesive disposed between the conductive frame and the lid. The electrically conductive adhesive has a substrate having passageways through the substrate defined by a number of internal surfaces having disposed a layer of conductive metal. The passageways are partially filled with a nonconductive adhesive resin.

U.S. Pat. No. 5,811,050 (Gabower) discloses a method for forming an EMI shield from polymeric material. The method comprises thermoforming sheets of thermoformable polymeric material into desired shapes. The thermoforming process comprises heating a thin sheet of thermoplastic polymer, drawing the heated sheet into an open mold or onto a die, cooling the formed sheet, removing the formed sheet from the mold or die, and applying electrically conductive metallic material to selected surfaces of the thermoformed polymeric shapes by vacuum deposition means.

U.S. Pat. No. 6,016,083 (Satoh) discloses an electronic circuit apparatus for suppressing electromagnetic radiation. The apparatus comprises an electronic circuit mounted on a top surface of a printed-circuit board. An input-output terminal is mounted on the printed-circuit board. A shield-case for suppressing electromagnetic radiation from the electronic circuit is included. A conductor-piece, allocated between the electronic circuit and the input-output terminal is provided connecting a first ground-pattern stuck to a bottom surface of the printed-circuit with the shield-case. A means for connecting the first ground-pattern with the input-output terminal via the conductor-piece is included. The connecting means is composed of a second ground-pattern stuck to the bottom surface of the printed-circuit board near the input-output terminal and a metallic-connecting-piece for connecting the second ground-pattern with the shield-case.

A common feature of these and other prior art electromagnetic interference shielding methods is that these methods focus on the enclosure and not on the radiating source. A break in the shield will form an aperture through which radiation can escape and thus great care must be taken to use conductive gaskets to seal access areas. In addition, a break in the shield may require that the entire electroninc device, or significant parts of it, be discarded as waste at a considerable expense. Conventional metalizing methods such as using conductive metal-bearing paints, vacuum plating of aluminum, physical vapor deposition of aluminum or other metals, plating on plastics, laminated metalizing methods, and using woven and coated fibers generally fail due to limited ductility, flexibility, and thermoformability.

IN THE FIGURES

FIG. 1 illustrates a cellular phone single-side conforming shield enclosure (form shield) for rear printed cicuit board (PCB) and enclosure housing with two isolation chambers. The form shield is a mirror image of the rear enclosure housing since the original equipment manufacturer did not have a CAD/CAM file. The form shield has 4 boss holes and winglet tip (leg) with extreme close tolerance area and accompanying dielectric battery cap (not shown).

FIG. 2 illustrates a cellular phone single-side form shield for rear PCB and enclosure housing with two isolation chambers. FIG. 2 is an angled exploded view of a form shield above a cellular phone rear housing showing details of X-Y-Z axis of form shield to enclosure. The PCB goes against a form shield, facing down (rear of PCB).

This form shield uses no thermoforming in design, but yields a 5 and 6-sided enclosure by folding.

Figure 7:
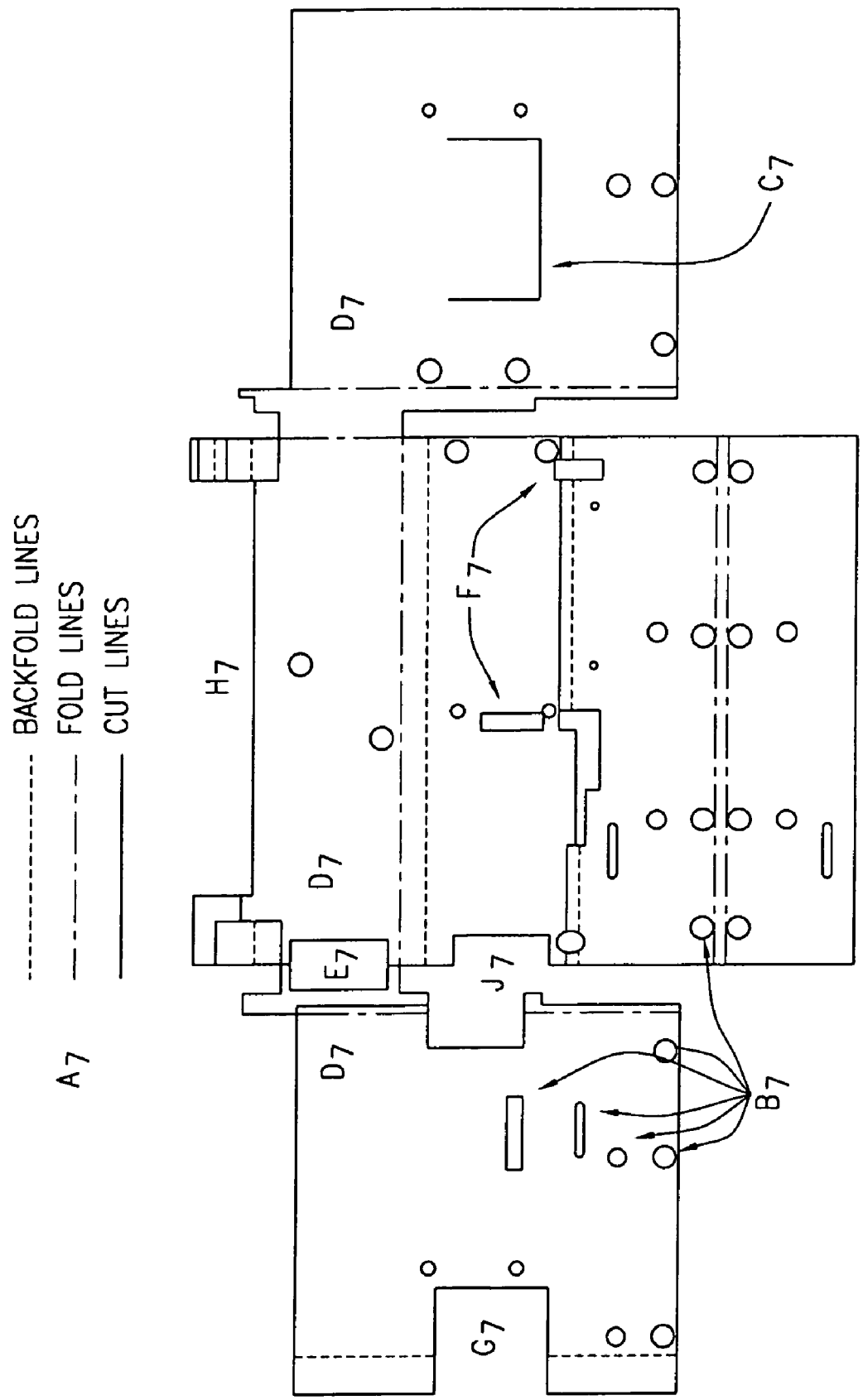
FIG. 7 illustrates a notebook computer form shield for CPU base-keyboard enclosure housing, done by crease-hinge-fold and cut method.
Figure 8:
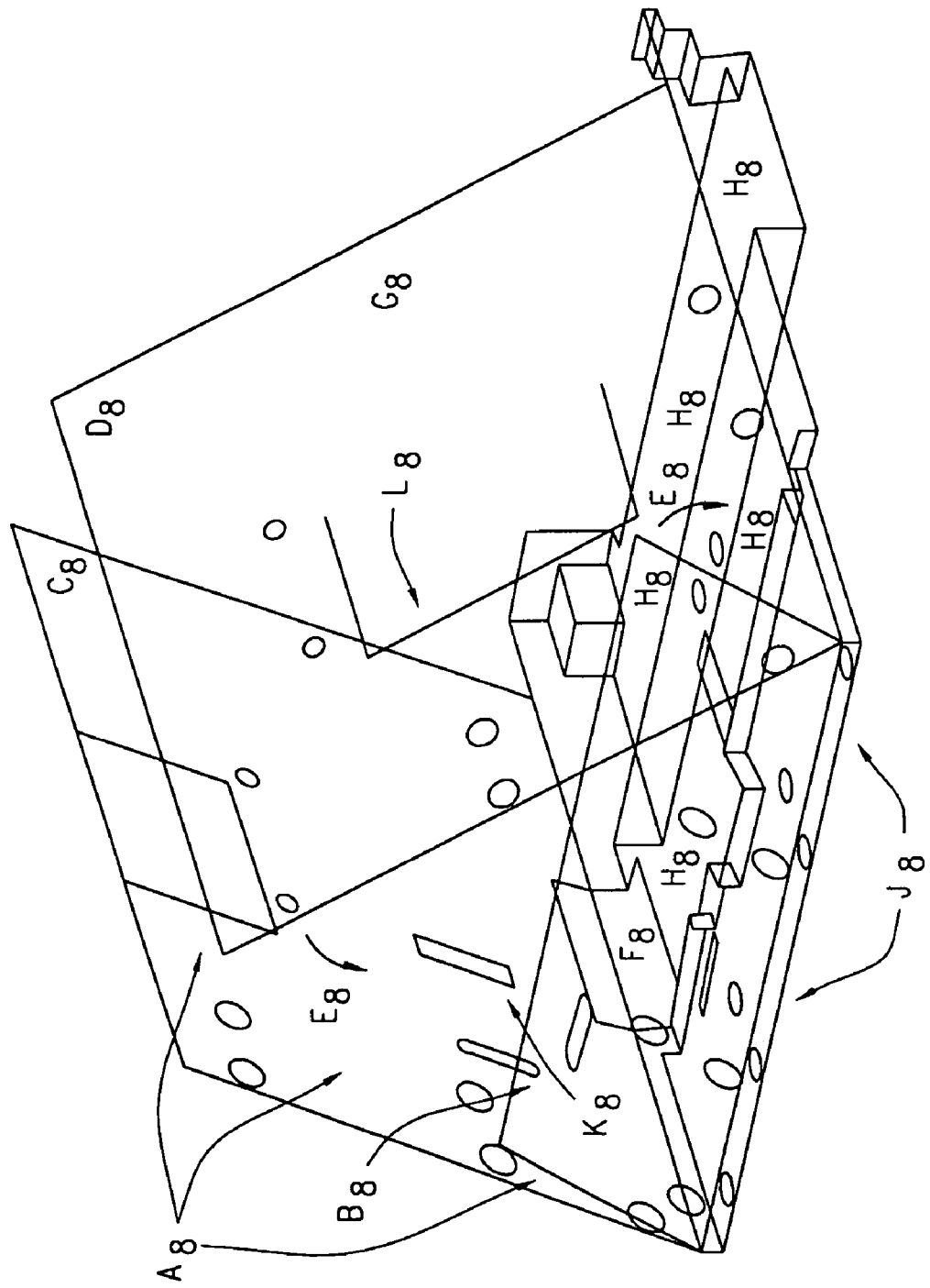

FIG. 8 illustrates a notebook computer form shield for CPU base-keyboard enclosure housing, done by crease-hinge-fold and cut method, as in shown FIG. 7, shown in angled and partially folded position of 3 crease-hinge folds.

Figure 9:
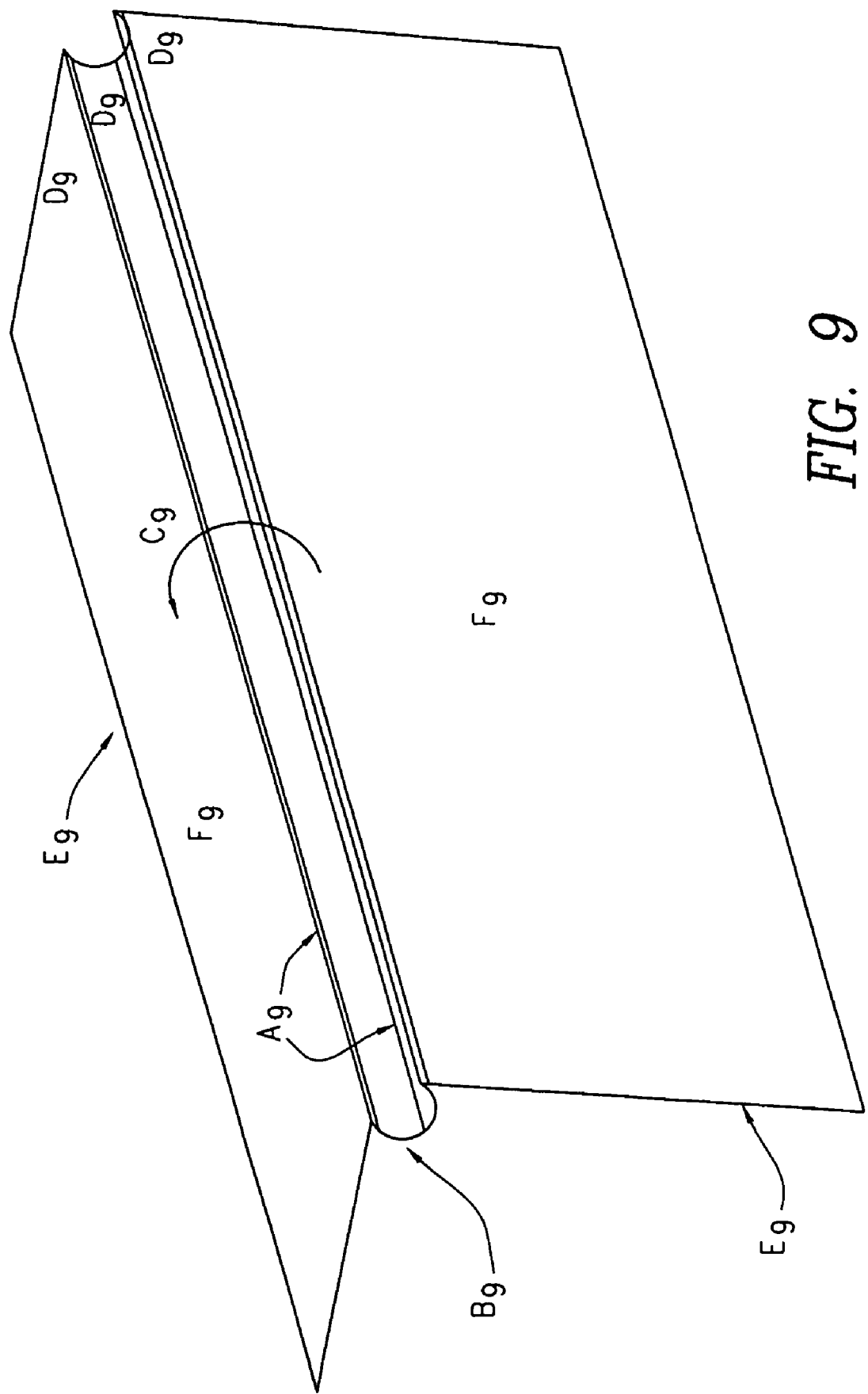

FIG. 9 illustrates a crease-hinge-fold angled side view of form shield or board shield winglet, elongated for display purposes, orientation as in thermoforming tool.

Figure 10:
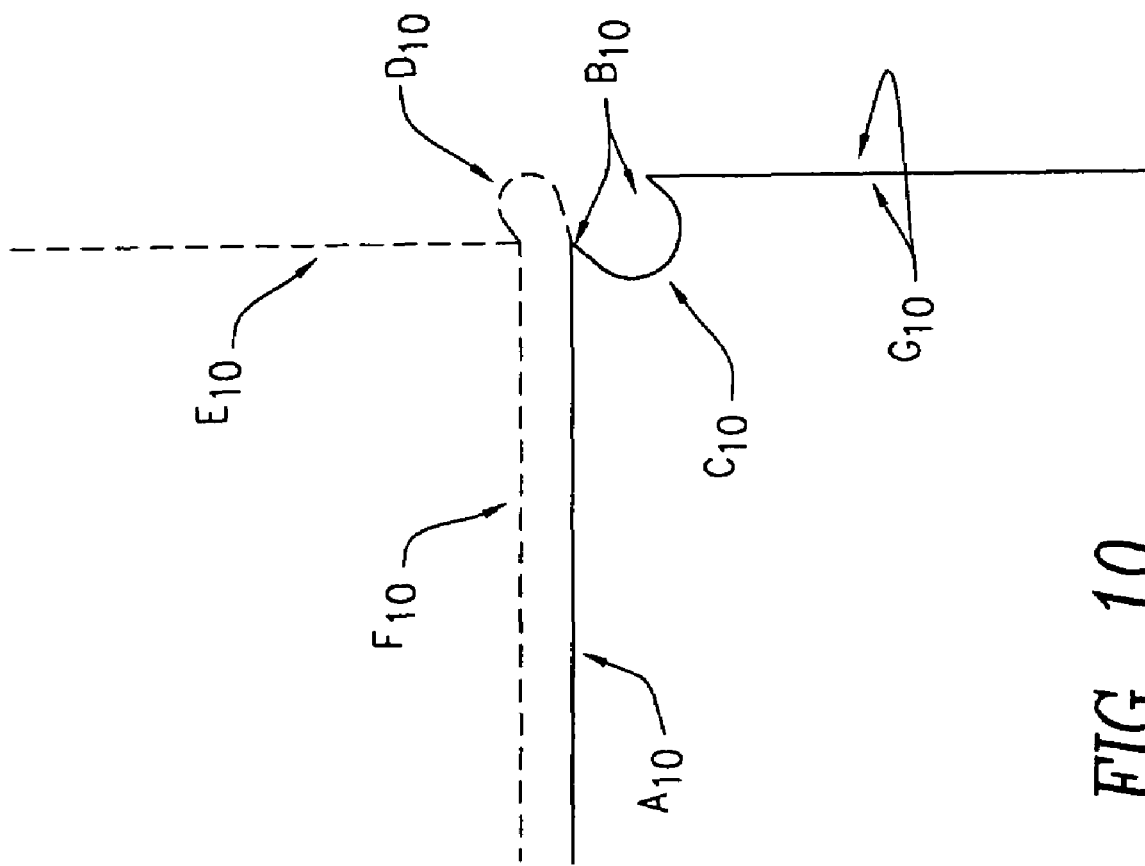

FIG. 10 is a crease-hinge-fold edge cross sectional view of form shield, board shield, or winglet shown in thermoformed position and prospective 180 and 270 degree fold-bends.

SUMMARY OF THE INVENTION

The present invention is directed to a shielded electronic component assembly comprising (a) a semiconductor device to be shielded from electromagnetic frequencies; (b) a reference potential source; (c) a housing enclosing the semiconductor device within the assembly; and (d) a conforming shield enclosure electrically connected to the reference potential source, wherein the conforming shield enclosure comprises a metalized thermoformable polymer having dimensions conforming to the inside of the housing and enclosing and thereby shielding the semiconductor device from electromagnetic frequencies, wherein the conforming shield enclosure is prepared by paint metalization.

In a preferred embodiment, the shielded electronic component assembly is selected from the group consisting of cellular phones, notebook computers, electronic enclosures, printed circuit boards, and printed circuit board integrated components. The thermoformable polymer may be selected from the group consisting of polycarbonate, polyacrylate, polyethylene terephthalate glycol, polyvinyl chloride, styrene, polyester, and mixtures thereof. Preferably, the thermoformable polymer is polycarbonate. More preferably, the thermoformable polymer has a thickness from about 0.005 inch to about 0.100 inch, and most preferably from about 0.005 inch to about 0.025 inch. The metalized thermoformable polymer may comprise metal particles selected from the group consisting of copper, silver, cobalt, titanates, niobates, zirconates, nickel, gold, tin, aluminum, magnesium, and alloys thereof. In one specific embodiment, the metalized thermoformable polymer comprises metal particles selected from the group consisting of iron, silver, nickel, ferrites, cobalt, chromium, magnesium, magnetic oxides, and alloys thereof. In another specific embodiment, the conforming shield enclosure comprises a thermoformable polymer having metal particles on an inside portion of the conforming shield enclosure. The conforming shield enclosure may comprise a thermoformable polymer having metal particles on an outside portion of the conforming shield enclosure. The conforming shield enclosure may also comprise a thermoformable polymer having metal particles on both an inside and an outside portion of the conforming shield enclosure. The shielded electronic component assembly may further comprise a plurality of semiconductor devices, wherein the conforming shield enclosure encloses and shields each of the plurality of semiconductor devices. The conforming shield enclosure may further comprise integrated thermoforming gasketing dots to provide a positive and constant pressure contact along a ground trace path of a printed circuit board and a specific integrated gasket path along a ground trace of a printed circuit board. The gasketing dots may provide a gasketing, isolating, and grounding path 0.5 to 1 inch wide grounding path along a printed circuit board. The conforming shield enclosure may comprise a crease/hinge/fold design to provide up to a 360 degree bend in the substrate or may comprise a zero-draft fold design having a crease designed onto a hinge with 4 edge slits placed at quadrants parallel to a creased-hinge to provide up to a 270 degree bend in the substrate. The conforming shield enclosure may also enclose and shield the semiconductor device from electromagnetic frequencies and be attached by an adhesive or a conductive adhesive.

In another embodiment, the present invention is directed to a method for shielding an electronic component from electromagnetic frequencies comprising the steps of (a) providing a semiconductor device; (b) providing a reference potential source; (c) electrically connecting a conforming shield enclosure to the reference potential source; and (d) providing a housing enclosing the semiconductor device, reference potential source, and conforming shield enclosure within the assembly; wherein the conforming shield enclosure comprises a metalized thermoformable polymer having dimensions conforming to the inside of the housing and enclosing and thereby shielding the semiconductor device from electromagnetic frequencies, wherein the conforming shield enclosure is prepared by paint metalization.

In still another specific embodiment, the present invention is directed to a method for preparing a conforming shield enclosure for shielding a semiconductor device of an electronic component assembly comprising the steps of (a) metalizing a sheet of a thermoformable polymer with an admixture of a conductive metal and a resin; and (b) thermoforming the metalized thermoformable polymer from step (a) to form a conforming shield enclosure; wherein the conforming shield enclosure has dimensions conforming to the inside of a housing of the electronic component assembly and enclosing and thereby shielding the semiconductor device from electromagnetic frequencies, wherein the conforming shield enclosure is prepared by paint metalization.

The method may further comprise the step of metalizing the conforming shield enclosure from step (b) with an admixture of a second conductive metal and a resin.

In yet another specific embodiment, the present invention is directed to a method for preparing a conforming shield enclosure for shielding a semiconductor device of an electronic component assembly comprising the steps of (a) thermoforming a sheet of a thermoformable polymer to form a conforming enclosure; and (b) metalizing the thermoformed polymer from step (a) with an admixture of a conductive metal and a resin to form a conforming shield enclosure; wherein the conforming shield enclosure has dimensions conforming to the inside of a housing of the electronic component assembly and enclosing and thereby shielding the semiconductor device from electromagnetic frequencies, wherein the conforming shield enclosure is prepared by paint metalization.

The method according may further comprise the step of metalizing the conforming shield enclosure from step (b) with an admixture of a second conductive metal and a resin.

DETAILED DESCRIPTION OF THE INVENTION

The present invention is directed to electronic components shielded from electromagnetic interference through the use of conforming shield enclosures. Conforming shield enclosures are flexible metalized thermoformed thin-wall polycarbonate polymer film substrates used to shield a radiation source. The present invention relates to conforming shielded forms for electronic component assemblies and specifically to electronic component assemblies which are shielded to protect against electromagnetic interference. Specifically, the shielded electronic component assembly comprises (a) a semiconductor device to be shielded from electromagnetic frequencies; (b) a reference potential source; (c) a housing enclosing the semiconductor device within the assembly; and (d) a conforming shield enclosure electrically connected to the reference potential source, wherein the conforming shield enclosure comprises a metalized thermoformable polymer having dimensions conforming to the inside of the housing and enclosing and thereby shielding the semiconductor device from electromagnetic frequencies.

Cellular Phones

A form shield is a flexible metalized (metal-coated) thermoformed thin-wall polycarbonate polymer film resulting in an electromagnetic compliance (EMC) solution for electromagnetic interference (EMI) and radio magnetic/frequency interference (RFI) shielding. A form shield is also a printed circuit board-electronic enclosure common conductive ground-plane. A form shield is also an electromagnetic interference and radio magnetic interference integrated conductive gasketing solution to the printed circuit board (PCB) of a cellular phone. The printed circuit boards of cellular phones have various integrated circuits (IC) and printed circuit board level functions that need to be isolated from other areas of the printed circuit board so as not to interfere electronically. This is generally done by a variety of methods which will isolate specific areas on the printed circuit board. A form shield incorporates integrated form shield gasketing dots in place of added die-cut conductive metal loaded rubber or silicon gaskets, form in-place conductive metal loaded silicon elastomer beads or machined metal clips directly attached throughout the cellular phone housing for printed circuit board area isolation purposes as well as for overall electromagnetic compliance shielding compliance.

A board shield is a version of a form shield used directly on the printed circuit board to isolate individual integrated circuit components or groups of components. This results in electromagnetic compliance shielding of the components of a printed circuit board at the printed circuit board level and of the entire printed circuit board or enclosure housing itself. Both a form shield and a board shield can be used on the front and rear of a printed circuit board depending on the number of printed circuit boards, integrated circuits and printed circuit board isolation chambers required. A form shield can also shield the side walls of printed circuit boards. A board shield can provide stand-alone isolation of individual board level integrated circuit components or isolation of groups of integrated circuit components or printed circuit board compartments. A board shield can be fully integrated with a form shield as an integrated circuit and printed circuit board-enclosure housing electromagnetic compliance shielding solution.

A form shield can be supplied as a single or two piece unit, depending upon dimensional, space or design restrictions of the printed circuit board and the enclosure housing or original equipment manufacturer (OEM) assembly preferences. A board shield can be supplied in as many units as required for integrated circuit isolation, groups of integrated circuits or in conjunction with a form shield. A form shield and a board shield provide a complete option or alternative to conformal shielding of cellular phones by conductive coatings (metal-filled paint), plating-on-plastics or vacuum plating (aluminum metalization) methods. Conformal shielding is where the enclosure or housing itself has the shielding technology integrated directly onto the surface-hence a conformal shield. A form shield and a board shield also provide a complete option or alternative to integrated circuit isolation and printed board circuit level shielding by board-level attached stamped and die cut metal cans, foils or laminates either alone or in conjunction with conformal shielding of a cellular housing enclosure. This avoids the use of separate enclosure housing-printed circuit board gasket assemblies and associated manufacturing or assembly costs and overheads.

A form shield can provide electromagnetic compliance for both molded plastic cellular phone enclosure housings such as engineering polymers, graphite or glass-filled composites, co-blended polymers and magnesium casting or injection molded enclosure housings. A form shield and a board shield can provide printed circuit board side (edges) of board shielding, unlike all other printed circuit board-level add-on technologies. A form shield and a board shield provide a ready and rapid access to the printed circuit board and integrated circuit components unlike board-level add-on shielding technologies. This provides a ready means for after market printed circuit board level repairs and component replacement at significantly reduced costs, time and rework losses. A form shield or a board shield need not be a mirror image of the design of either a plastic or metal cellular phone housing enclosure. Design or manufacturing limitations of a molded enclosure housing which may limit or hinder conformal shielding do not hinder a form shield or a board shield. A form shield or a board shield only needs to fit within the enclosure housing itself.

The shielding capability and effectiveness of a form shield or a board shield can be specifically designed according to customer or regulatory electromagnetic compliance requirements by varying the degree of metalizing film and/or a form shield gasketing dot design and pitch. A form shield and a board shield offer reductions in weight penalty problems associated with board-level cans, foils, sheet metal or laminates. A board shield offers reduction in dimensional problems and limitations associated with board level cans, foils or laminates. Both a form shield and a board shield can be easily removed or replaced. Both a form shield and a board shield can be recycled. A form shield or a board shield may have copper, silver-copper blends, silver, or other metals and alloys included in the film.

A form shield and a board shield may incorporate one of two proprietary crease-hinge-folds to shield both sides of a printed circuit board. This in turn results in the option of a one-piece unit versus a two-piece unit. This also allows the unique capability of becoming a thermoformed 6-sided single piece box from a single piece 4 or 5-sided partial box, while maintaining common electrical ground continuity and a seamless electromagnetic compliance design. A form shield or a board shield may integrate added structural elements for printed circuit board or enclosure housings strength, rigidity or stiffening purposes. A form shield, form shield gasketing dots, and a board shield will accommodate analog, GSM, CDMA, TDMA or PCA MHz to GHz frequency cellular phones. Both a form shield and a board shield are bendable, flexible and elongate (stretch) without losing electrical conductivity and continuity due to cracking or flaking. They also maintain an active common ground plane path. This allows for being used for encapsulation methods of shielding and integrated circuit isolation, separate RF isolation or printed circuit board stand-alone integrated circuit components. A form shield and a board shield can be considered 3-dimensional, not 2-dimensional as in all additive technologies.

The use of a form shield and a board shield are not only electromagnetic compliance solutions. The use of a form shield and a board shield allows for proper corrosion protection of metal magnesium, aluminum or graphite filled enclosure housings without compromising electromagnetic compliance or common ground plane values.

Notebook Computers

A form shield is a flexible metalized thermoformed thin-wall polycarbonate polymer film resulting in an electromagnetic compliance solution for electromagnetic interference and radio magnetic interference shielding. A form shield is also a printed circuit board-electronic enclosure housing common conductive ground-plane for a notebook or palm top computer. A form shield replaces add-on technology such as sheet metal, metal foils and laminates, as well as conformal shielding of conductive coatings, plating-on-plastics or vacuum metalizing or any combination therein as an electromagnetic compliance shielding solution. A form shield and a board shield allow for removal of corrective conductive metal-filled or metallic gaskets for electromagnetic compliance due to improper grounding, poorly designed seams or form and fit enclosure housing problems. Neither a form shield or a board shield depend upon the structural or design limitations of the molded plastic or magnesium enclosure housings to ensure electromagnetic compliance. Shielding effectively takes place at the printed circuit board level rather than at the housing itself. A form shield as a 3-dimensional electromagnetic compliance solution focuses on the printed circuit boards and not the enclosure housing.

A board shield addresses integrated circuit component shielding on the printed circuit board itself. Integrated circuits may be on both sides of the printed circuit board, unlike some cellular phone printed circuit boards, and the use of a board shield for integrated circuits or groupings of integrated circuits allows for board-level isolation similar to that of a cellular phone printed circuit board. A board shield use can also be significant in shielding of the central processing unit (CPU). Unlike radio frequency high energy and frequency above 1.0 GHz sources on a cellular phone, which may be totally encapsulated in metal cans, the central processing unit processor on a printed circuit board of a computer uses a zero-insertion force ball-grid array connector attachment. This means that it is fully exposed on all 5 sides above the printed circuit board and results in emitting significant radiation as well as having potential problems with susceptibility to other radiation interfering with the central processing unit itself.

With the high power of the central processing unit comes additional heat and metal heat sinks, attached thermal pads, and heat pipes to aid with cooling the central processing unit. This may create even greater radiating sources. A board shield can also address the central processing unit cooling heat sinks and heat pipes electromagnetic compliance issues. The above are viable issues for all computers-notebooks, desktops, servers and tower unit configurations.

A conventional notebook or palmtop computer has the radiating central processing units and printed circuit boards in the lower base-keyboard cover two-piece housing. The flip-up screen color LCD display is composed of a two piece front and rear bezel (housing). A form shield is used in shielding both the base-keyboard cover printed circuit boards, hardware and the LCD screen and any associated printed circuit boards and hardware. Inherently, these are separate form shields. For the color LCD screen display, a form shield can be a thermoformed 5 or 6-sided electromagnetic compliance solution.

A form shield may incorporate proprietary crease-hinge-folds to allow shielding on both sides of a printed circuit board. A board shield may also incorporate proprietary crease-hinge-folds hinge to allow isolating of integrated circuit's on either side of a printed circuit board. A board shield may stand alone or be used as a common-ground with a form shield as a integrated shielding system. A board shield and a form shield may be used in shielding of daughterboards in relation to the motherboard or main central processing unit printed circuit board. A board shield and a form shield may be used to shield auxiliary printed circuit boards such as used for video, audio or input devices such as touch pads or a mouse. A form shield can create a 5 or 6-sided electromagnetic compliance shielding solution depending on design of the printed circuit board or assembly limitations of the computer. The thermoformed aspect of the form shield as an inherent 5-sided shield offers unique aspects in use on a notebook computer. A form shield and a board shield can incorporate internal walls independent of the plastic molded or magnesium enclosure housing for increased electromagnetic compliance protection. This is an important aspect in knowing that a notebook computer has access bays and portals that allow for excessive radiation leakage problems and design constraints for electromagnetic compliance control. A form shield can replace add-on sheet metal or metallic foil shields needed for electromagnetic compliance with accessory bays for swappable electronic components such as batteries, replaceable drives, PCA cards, CD-ROM units, and similar devices. A form shield and a board shield allow for tighter tolerance designs and dimensions over add-on shielding technology. A form shield and a board shield both allow for lighter weight products over add-on shielding technology.

A form shield and a board shield can allow either a metalized or dielectric side to be facing electronic components. Conformal shielding technology can only have metallic surfaces facing the electronics, and add-on technologies for the most part are 100% metal and require additional dielectric protection to prevent short circuiting of a printed circuit board. A form shield can common ground to a printed circuit board's rear metal bezel. A form shield and a board shield incorporate 3-dimensional design aspects for printed circuit board. A form shield winglet involves the proprietary crease-hinge-fold aspect and the sixth side may not be a full coverage element. Accordingly, this aspect is called a form shield winglet which may used in conjunction with a thermoformed form shield or may be used as a stand-alone electromagnetic compliance option. A form shield winglet may aid in electromagnetic compliance by acting like a secondary shield for a portal or connector assembly.

The winglet may aid in shielding of wire harnesses or individual wires leading outside of a form shield.

Electronic Enclosures

A form shield is a flexible metalized thermoformed thin-wall polymer film resulting in an electromagnetic compliance solution for electromagnetic interference and radio magnetic interference shielding. A form shield is also the common conductive ground of a printed circuit board-electronic enclosure housing. A form shield allows encapsulation (wrap-around) of an electronic enclosure's printed circuit boards to assist in meeting electromagnetic compliance. A form shield for a printed circuit board may consist of a single 6-sided proprietary crease-hinge-fold two-sided form shield or two individual 5-sided form shields for a printed circuit board. Multiple printed circuit boards may require form shields for each printed circuit board or a form shield encapsulating the cluster of multiple printed circuit boards within the electronic enclosure.

A form shield with a winglet may be used to aid in electromagnetic interference/radio magnetic interference shielding. A winglet may replace sheet metal or metallic foil and may be integrated to the form shield to represent a common ground path. A winglet also allows a common ground path from a form shield to other electronic hardware components. A board shield may act alone or in conjunction with a form shield to allow localized shielding at the printed circuit board level to meet electromagnetic compliance. An electronic enclosure may not meet electromagnetic compliance simply due to a single or multiple integrated circuit on the printed circuit board and the use of a board shield may allow electromagnetic interference/radio magnetic interference compliance by isolating the radiated noise on the printed circuit board.

A board shield may also use a winglet. A form shield and a board shield are both readily removable and are recyclable. As an electromagnetic interference/radio magnetic interference shielding solution, both a form shield and a board shield do not affect the physical properties of an electronic enclosure. At the end-of-life (EOL) cycle of an electronic enclosure, both a form shield and a board shield may be removed from the enclosure and from an electromagnetic compliance and the electronic enclosure housing may then enter a recycling stream. Other added elements to the enclosure housing such as metal inserts on bosses, decorative paint, heat-staked assemblies, etc. must still be removed to yield the enclosure base material as pure as possible to the satisfaction of the recycling stream supply requirements. A form shield and a board shield will meet Sweden's TCO-99 electronic enclosure recycling compliance requirement. The use of a form shield or a board shield by any electronics manufacturer will not in any way hinder either recycling of the enclosure housing or printed circuit board or complying with TCO-99 standards. Presently 100% of all conformal shielding technologies are TCO-99 non-compliant and their use disallows a TCO certificate of approval and labeling of the entire electronics device.

The size, housing complexity, dimensions, hardware additions and assembly techniques of the electronic enclosure are not directly related to the electromagnetic compliance issues of a form shield or a board shield. Both a form shield and a board shield are only influenced by an enclosure housing in that they need to fit within the housing, noting the physical and dimensional tolerances needed for their use. An electronic enclosure housing's air vent holes or slots for radiant cooling or fan air flow are not affected by a form shield or a board shield.

Printed Circuit Board

A form shield is a flexible metalized thermoformed thin-wall polymer film resulting in an electromagnetic compliance solution for electromagnetic interference and radio magnetic interference shielding of a printed circuit board. The form shield can provide a common ground to the rear metal bezel of a printed circuit board or to common ground areas of the printed circuit board. The use of a form shield to shield a printed circuit board entails use of a one or two-piece form shield. In shielding one side of a printed circuit board, the form shield is designed to address that side of the printed circuit board, and may or may not contour the board components. A second form shield is then created for the other side, if required.

A form shield may also be designed to encapsulate the entire printed circuit board as a single piece form shield. By incorporating proprietary crease-hinge-folds, a form shield is folded to cover the opposing side of the printed circuit board and in effect become a 6-sided single-piece form shield.

Both sides of the printed circuit board and the integrated circuits and components are then shielded by a single form shield electromagnetic compliance solution. A form shield may also use winglets on the same side as the form shield or when using a proprietary crease-hinge-fold, the form shield winglets may be placed on the opposite side of the printed circuit board.

A form shield can also directly incorporate form shield gasketing dots to allow a specific integrated form shield-gasket path along the ground trace of a printed circuit board (generally a 0.5 to 1 inch wide gold plated line path). This allows for complete isolation or containment on a printed circuit board. Multiple printed circuit board isolated compartments can be incorporated on the printed circuit board, within reasonable physical dimensional limitations, and all are shielded and isolated by a single form shield. The form shield gasketing dots make a positive pressure contact along a printed circuit board's ground trace path, replacing secondary added metal filled flexible gaskets or metal mechanical clips as means of a conductive gasketing seal of the gap between the printed circuit board and a metalized molded-in internal wall of an enclosure matching the printed circuit board ground plane trace. The form shield gasketing dots maintain constant contact to the printed circuit board ground trace and may have varying degrees of pressure contact force, dimensions and pitch (closeness of each a form shield gasketing dot). Unlike other conductive gasketing methods the form shield and form shield gasketing dots are one-in-the-same being designed to offer a continuous uninterrupted electrical path to the printed circuit board ground trace.

A form shield also replaces printed circuit board isolation metal cans for isolating chambers of a printed circuit board, but is able to shield the entire printed circuit board at the same time. A form shield may incorporate the central processing unit in shielding design in a printed circuit board. A 3-dimensional form shield encapsulates the central processing unit on the printed circuit board and 2 or 3 of 4 sides are slit in the form shield to allow access to the central processing unit. A form shield can accommodate central processing unit heat sinks, heat pipes and the fans used for central processing unit cooling.

Printed Circuit Board Integrated Circuit Components

A board shield is a flexible metalized thermoformed thin-wall polymer film resulting in an electromagnetic compliance solution for electromagnetic interference and radio magnetic interference shielding of integrated circuit components on a printed circuit board. A board shield can provide a common ground to the printed circuit board in conjunction with a form shield or directly to common ground areas of the printed circuit board. A board shield allows for isolation of individual integrated circuit components, groups or clusters of integrated circuit components on the printed circuit board. A board shield is designed to allow for integrated circuit component isolation on the printed circuit board itself. Unlike a board level "can", a board shield may have the metalized side facing towards or away from an integrated circuit. Since a board shield is a thermoformed 3-dimensional integrated circuit isolation, it offers printed circuit board shielding design options unlike all other board-level shielding options.

A metal can or foil laminate has serious limitations as to its manufacture, design or dimensional restrictions. It needs to be attached to a printed circuit board by means of direct wave solder to attached through-hole pins or by an added fence base which itself is attached to the printed circuit board through wave soldering through-hole pins, and this base supports the integrated circuit isolating can or shield. A board shield can come in direct contact with an integrated circuit and may be attached to the printed circuit board by any of the following means: pressure point; adhesive to integrated circuit; conductive elastomer adhesive; mechanical; pre-positioned on a form shield; and pre-positioned on the printed circuit board. A board shield isolation of individual integrated circuit components on a printed circuit board is independent of the enclosure design and features limitations. A board shield may have added structural stiffness for mechanical support.

Form Shield and Board Shield—Features and Benefits

Some of the benefits of a form shield and a board shield include: light weight-added original equipment manufacturer manufacturing or marketing benefits; less dimensional change than sheet metal, foils or laminates; 3-dimensional better shielding and fewer components and complexity; cost savings; several proprietary crease-hinge-folds for a single form shield; recyclability-TCO-99 compliance; thermoformed board shield and form shield seamless electromagnetic compliance solutions; enclosure substrate material-polymer, composite or metal is not important; options of where dielectric side is placed; close tolerance; polycarbonate film base-strength and rigidity; thin or thick film-shallow or deep form shields and board shields; form shield gasketing dots permit removal of conductive gasketing materialor adhesives; and better continuity; added physical support-strength, rigidity and support; UL options; can be replaced without discarding entire device; pre-coat/post-coat; anti-corrosive; and manufacturing of shielding can be separate from assembly.

Board Shield, Form Shield and Form Shield Gasketing Dots Thermoforming Process

Close examination of the design of an electronic enclosure device and accompanying printed circuit boards, integrated circuit connectors, wire harnesses, displays, access bays, and portals reveals a variety of opportunities for a board shield and a form shield thermoformed electromagnetic compliance solution. Once these elements have been closely studied, a variety of designs are considered with regard to: thermoforming-tightness of fit and tolerances; repeatability; assembly electromagnetic compliance and common ground issues; proprietary crease-hinge-folds tolerances for winglets or two-side options of a form shield and a board shield; attachment and location issues; use in conjunction with a conductive gasketing adhesive form shield gasketing dots for printed circuit board compartment isolation; board shield isolation of printed circuit board integrated circuit components or sections; and die cutting to establish vertical wall portals and tolerances in the form shield or a board shield.

An original equipment manufacturer of an ongoing or new electronic enclosure's design for electromagnetic compliance is addressed though access of the engineering CAD/CAM file of the enclosure housing, printed circuit board, integrated circuit and component population, prototype parts by means of machined polymer or Stereo Lithography Assembly (SLA) housings and all related component hardware and sub-assemblies. Traditional electromagnetic compliance shielding and grounding methods and hardware, either conformal or add-on technologies, do not influence or directly address the board shield or form shield design or outcome.

It is required that access to the printed circuit board be made available and that board level design and integrated circuit component changes be readily made available in engineering form or real-time examples since a form shield and board shield address shielding first at the printed circuit board and integrated circuit level rather than just at the electronic enclosure housing.

From the original equipment manufacturer prototype work, a design or designs are chosen and a prototype production thermoforming tool, being of male or female orientation, depending on the board shield and form shield design, and associated prototype steel rule die cutting tool are built from the CAD/CAM files and a board shield and a form shield design engineering work. This incorporates creating a unique thermoformed 5-sided shield, with possible use of several proprietary crease-hinge-folds to make a fold-over 6-sided (twin-sided) form shield or board shield, winglets, or form shield gasketing dots for electromagnetic compliance.

The prototype form shield and board shield thermoforming and die cutting tool design take into consideration the following: thermoforming machine capability-film roll web thickness, length, width and draw dimensions; thin-film dielectric thickness, from water-free specialty 0.005 inch to 0.025 inch polycarbonate film; color of polycarbonate for heat retention and time to create thermoforming film sag; thermoform tool temperature control capabilities; vacuum or pressure forming drawn-down design to get tight and precise film thermoforming tolerances yet to be easily removed from the thermoforming tool in production; multiple thermoforming and die cutting cavities for production capacity output, consistency and cost reduction purposes; thermoforming conditions of heating time, heat zone temperatures and thermoforming tool interaction to allow tight tolerance thermoforming without sags, distortions, web creep or tearing of the thin-film during processing; creation of various proprietary crease-hinge-folds for winglets or 6-sided options; orientation of the thermoform axis in relation to part size, depth, details and complexity.

In traditional thermoforming, cut sheet film is used for prototyping, rather than continuous web film being supplied on 450-500 pound rolls, in conjunction with a sheet or web-fed vacuum or pressure thermoforming machine. The use of such high precision and detail for a board shield and form shield, without using thin-film polycarbonate and 100% production design tooling and techniques, results in prototyping that are both unreliable as well as unsatisfactory when using conventional polymers and stock fed sheet thermoforming methods. The properties of a board shield and form shield dictate the use of production thermoforming tooling and thermoforming equipment, web-sourced thin-film polycarbonate and precise operating conditions for reliable and repeatable prototype thermoforming for prototyping or production purposes.

Thermoforming of thin-film polycarbonate requires the use of dry, preheated roll film at the proper time and temperature in relation to the thermoforming tool orientation and production design to ensure a successful outcome. Thermoform tool design of vacuum holes placement, tool materials, cavity orientation to web sag and draw percentages are all interrelated to ensure proper and repeatable outcome for the unique thermoforming of a board shield and form shield. The exact thermoforming process needs to take into consideration the following: production prototype tool material-7075 aluminum; polycarbonate film thickness; film dryness; location and orientation of cavity or multiple cavity on the thermoforming tool, designed to achieve full and precise film drawn down; web speed in relation to time to reach temperature, web size and draw down percentages; web sag to uniformly meet thermoforming tool; critical vacuum hole placement for uniform draw down to the thermoforming tool; male or female thermoform tool orientation-depending on complexity and draw down; proper tool detail vertical edge wall surfacing and angled drafts to allow tight tolerances yet not rip or tear either upon web sag reaching thermoforming tool contact or web release upon production cycling; thermoform tool temperature controls; male tool pressure; time coordination to meet mating web sag; zone heat adjustments; and shrinkage of the film in all 3 axes, depending on film thickness and thermoforming processing.

A series of thermoforming cycles are done to first establish benchmark operating parameters. A number of thermoforming cycles are first done, then between 100 to 500 thermoforming cycles to further establish changes due to temperature or tool warm up. Minor changes are made to the web speed, temperature heat zones, tool temperature, amount and consistency of film sag required.

Modification of the thermoforming tool may be immediately done to accommodate under-filled areas or hot spots due to errors in web release, tearing, web creep or blocking. Different board shield and form shield designs can be tested under identical conditions if a multi-cavity thermoforming tool is created.

Thermoformed parts from each cavity, if multi-cavity, are removed and checked against dimensional stability to a prototype or production printed circuit board, integrated circuits or enclosure housing. The entire prototype production run is checked 100% to find any evidence of inadequate thermoforming or potentially problematic thinning or tearing of the film in complex detail tooling areas.

Excessive shrinkage, inadequate full details or web creep are common problems using lower quality or less sophisticated techniques and thermoforming tooling. If the use of crease-hinge-folds have been employed, they are at this point checked for flexibility and stability. A sampling of thermoformed parts are cut with a steel rule die to measure and establish dimensions and tolerances of trimming in relationship to the transferred CAD/CAM files and thermoforming process for all cavities used. Review is done of the thermoforming process and thermoforming tool in relation to the manufacturing processing, losses, tightness and throughput. Changes to the thermoforming tool, board shield or form shield design are undertaken at this point, usually with immediate tool changes and are re-qualified by again thermoforming to resolve a problem area or design change.

Later sections will detail pre- and post-metalization, steel rule die cutting or matched-metal dies and crease-hinge-fold work. A certain number of board shields and form shields are taken uncut for metalization, if pre-metalized, followed by die cutting for electromagnetic compliance testing and original equipment manufacturer approval. Work at this point starts on the board shield or form shield blueprint.

Based on the prototype work, a production-type thermoforming tool and either steel rule cutting die tools or matched metal die cutting tools are then generated from the same CAD/CAM files to incorporate any of the board shield or form shield changes due to either process improvements or customer engineering change orders (ECO). Production capability is now established and the multi-up thermoforming tooling is generated for production and output consistency, which is not necessarily the case in prototyping a board shield or a form shield.

Depending upon the size of the thermoform footprint, one could have up to 24+ cavities on the thermoforming and cutting tools. From the prototype thermoforming tool, changes or modifications in the prototype thermoforming tool to address questionable or difficult areas have been addressed and the production thermoforming tool is created, both from the electromagnetic compliance design standpoint, as well as manufacturing and output considerations. The new production thermoforming and cutting tool is then pre-qualified on a short pilot run to ensure dimensional and output capability.

Polycarbonate film of 0.005 inch to 0.025 inch thickness up to the equipment limiting web width is pulled from dry control storage and set up. Thermoforming tool and web zone temperatures are established to allow sufficient web sag, without tearing or slowing thermoforming production output. Web and tool temperatures are measured using a IR source and are duly noted. During production as the tool or ambient temperatures change, modifications are made in the temperatures used for both web preheat and thermoforming tool.

The polycarbonate film is fed from the web onto a heating platform. Based on the film thickness, draw down percentages and thermoforming tool complexity, the film is indexed into a preheat zone, then a heating zone to allow web sag under controlled time conditions. When ready, the web is rapidly indexed to the thermoforming station and is immediately lowered onto the thermoforming tool where vacuum and or pressure is used to create one or more board shield or form shield.

Vacuum, pressure or pressure assist thermoforming may be used in the thermoforming process in creation of a board shield or a form shield equally, the polycarbonate film may be pre-metalized using any of several coatings or may be post-metalized by a variety of methods. Once the thermoformed board shields or form shields are indexed from the thermoforming station as part of a continuous web, they are separated or cut from the web for ease of handling. The board shields and form shields are randomly checked against printed circuit board, integrated circuits or enclosure standards for dimensional stability and 3-dimensional usage throughout the production run.

Cellular Phone Differences

Thermoforming of a board shield or a form shield for a cellular phone has specific unique characteristics as follows: extremely tight tolerances in all 3 axes; extreme weight limitation; limited dimensional change tolerance; addition of custom designed form shield gasketing dots for printed circuit board common ground; form shield gasketing dot closure forces; greatest flatness of horizontal form shield surfaces; possible printed circuit board battery dielectric isolation; shielding of radiated frequencies in excess of 30 GHz; a board shield establishing isolation integrated circuits or grouped integrated circuit areas on a printed circuit board; possible printed circuit board edge end shielding if space is available; limitations of magnesium enclosure housing over molded polymer enclosure housings.

The physical nature of a cellular phone, be it of analog, GSM, PCA, CDMA or TDMA technology, single or multiple band phone circuitry, all incorporate the above differences. A form shield and a board shield are uniquely qualified as an electromagnetic compliance option as they address inherent electromagnetic compliance or physical limitations of integrated circuit isolation, shielding and common ground plane over conventional methods.

From a thermoforming standpoint, a board shield or a form shield is of the thinnest nature, 0.004 inch to 0.010 inch. This is the tightest tolerance form shield due to the physical limitations of a cellular phone as well as the printed circuit board population density. Equally, a board shield has even tighter tolerances for integrated circuit components. Isolation of cellular phone integrated circuits, integrated circuit components or chambers on the printed circuit board itself as well as printed circuit board edge ground plane incorporates matching of a board shield to the integrated circuits and a form shield to the printed circuit board ground traces and adding form shield gasketing dots. These integrated and continuous form shield gasketing dots take the place of additional printed circuit board enclosure conductive isolation techniques such as metal clips, form-in-place metalized gaskets, and conductive adhesive materials. A distinct advantage is that the continuity and integrated aspect of the form shield gasketing dots to the form shield and board shield allow greater grounding, superior contact, and lower resistivity versus conventional methods.

In addition, lower weight and a seamless electrical continuity yield a far better electromagnetic compliance shield and common ground plane over all other additive gasketing methods. Unlike conformal shielding methods of plating, vacuum or conductive paints on the enclosure platform itself, a form shield and a board shield are not limited by the enclosure, vendor base, selective mask tooling, sophistication and locations of vendor base or final assembly geography point. A form shield may add sub-compartments for added isolation of a radiating integrated circuit components or printed circuit board isolation area, emulating a board shield, but is also shielding the printed circuit board. A form shield addresses the printed circuit board shielding not the enclosure housing design. Form shield gasketing dots are designed to height, pitch, closure force and footprint to the common ground plane path depending upon requirements of the printed circuit board.

All the above require unique tooling, thermoform tooling and thermoforming, and may incorporate the following: limited multiple cavity use due to the intricate and detailed nature of the design and form shield gasketing dots; enclosure limitations or deficiencies which may be transferred though a board shield or a form shield; ultimate flatness of the board shield or form shield; anticipation of a molded enclosure's dimensional variances that could limit a form shield's effectiveness due to warping of the form shield due to uncontrolled shrink; multiple polymer or metal tool sources yielding varying dimensional stability of an enclosure.

Notebook Differences

Thermoforming of a board shield or a form shield for a notebook or palmtop computer has specific unique characteristics to consider as follows: internal enclosure housing walls;

individual compartments and connectors for swappable items or accessories; live or "hot" swappable component grounding needs; central processing unit heat sinks and/or heat pipes for heat dissipation; central processing unit cooling fans; multiple printed circuit board's in varying arrangements and locations; printed circuit boards at varying heights; grounding to rear printed circuit board bezel assembly; wires for speakers, microphones which are "loose" which may act as antennas; wire harnesses for color LCD screen displays; separate color LCD screen display and printed circuit board controls; connectors for bay accessories; dielectric side facing electronics; multiple bay portals for external access; internal slots for access to components; use of proprietary crease-hinge-folds for two-sided form shield or board shield options; hard point attachment to printed circuit board or to enclosure options; UL compliance; keyboard grounding-portal size.

One needs to consider not only internal access to the printed circuit board from top or bottom side, but internal and enclosure end portal access. Wiring of screen harnesses and internal connectors for drives, accessories, color LCD and multiple printed circuit boards demand a unique "user friendly" and manufacturing assembly approach. Design of the enclosure body, be it polymer or magnesium, is not necessarily of consequence in designing or influencing a board shield or a form shield.

A common ground for a keyboard is required. Access to the underside of the notebook printed circuit board is a consideration. Frequent use of internal sheet metal for electromagnetic compliance, common ground or compartment isolation, may be a disadvantage in the overall board shield or form shield design. Poor or inadequate design dictates the use of sheet metal or foils, and in most cases, the sheet metal or foils are discarded when using a board shield and a form shield. It should be noted that a form shield resolves what the sheet metal or foils were intended to do—electromagnetic compliance or compartment isolation used as an afterthought in the design, when used in conjunction with conformal shielding.

Use of sheet metal of foils exclusively for shielding a notebook computer yields a very complicated electromagnetic compliance solution and requires significant amounts of sheet metal use and integration, along with possible use of conductive gaskets. The use of conventional conformal shielding exclusively for shielding a notebook computer may neglect seams and internal isolation which may require use of add-on electromagnetic compliance options such as sheet metal, foils or conductive gasketing materials. Notebooks are dual radiating source devices due to separately housed central processing unit-color LCD screen display assemblies, and thus typically have shielded connecting wire harness, as well as color LCD display screen printed circuit board electronics to consider. When thermoforming for a notebook computer, one has to consider three dimensional die cutting options and internal slits or access. A form shield design has to also consider poor or limited options for sub component access from the exterior.

The form shield or board shield can have added walls for structural rigidity and support to replace or augment sheet metal. The use of selective dielectric options allows close if not direct integrated circuit, printed circuit board or live-circuit physical contact. This allows very tight tolerances, weight and dimensional advantages. With the use of several proprietary crease-hinge-folds, a form shield allows fold over winglets added options of selective shielding or wrap-around isolation of a printed circuit board on a broader scale. A board shield used on a notebook printed circuit board may be far more extensive due to the number of integrated circuit chips and locations. Integrated circuits may be on both sides of the printed circuit board motherboard and daughterboards. Central processing unit shielding is also a board shield consideration, in conjunction with heat sinks or heat pipes use with the printed circuit board motherboard.

Electronic Enclosures

Thermoforming and use of a board shield and a form shield for a generic electronic enclosure and printed circuit boards may have specific unique characteristics to consider, be it a disk drive, tower computer unit, large metal frame enclosure with doors or a very complex multiple enclosure housing as in a medical analytical measuring device as follows: air ventilation slots or holes; box-lid or mid-height clamshell design; front and or rear bezels; stand alone bezels; foam molded enclosure-ribs-struts for support; flat panel plasma of LCD displays; flexible wire harnesses or printed circuit boards; susceptibility issues; voltage spikes if 220/440 V direct power; transformers; lightning strike path prospects; hostile environment use considerations; large enclosures; tall height as in towers; structural aspects for support or rigidity; open access-slits, access bays or doors for large area internal access; ground to metal chassis if metal frame structure; ground to magnesium chassis; complex common ground paths; printed circuit boards at various locations and heights.

The multitude of industrial or medical electronic enclosures have two common radiating items printed circuit boards and associated wiring as in wire-harness or point-to-point wires. A small enclosure may incorporate a board shield or a form shield for integrated circuit and printed circuit board shielding encapsulation, where as a very large enclosure may require a form shield in a different manner. It is possible to have multiple form shields at the board level and enclosure level. The enormous variety of enclosures sizes and functions preclude any general assessment other than the above noted thermoforming or design considerations. There is a preferred maximum size consideration for thermoforming of a form shield of approximately 48 inches by 96 inches by 24 inches deep, however layered ones can be made.

Printed Circuit Board and Integrated Circuits

Designing and thermoforming a form shield for a printed circuit board or enclosure housing or use of a board shield in isolation of printed circuit board integrated circuits, integrated circuit grouped components of a printed circuit board have the following characteristics: use as a substitute for added metal cans for integrated circuits of printed circuit board compartment isolation; possible use in conjunction with metal cans; consideration of multiple printed circuit boards; printed circuit board edge shielding as in edge wrap-around; use of proprietary crease-hinge-fold for two-sided form shield, board shield or winglets; addition of form shield gasketing dots to printed circuit board ground trace; board shield attachment methods; use for flex circuitry or harnesses shielding; allows for shielding isolation compartments on the printed circuit board; allows for integrated circuit or integrated circuit grouping isolation on the printed circuit board; removability or printed circuit board access-repair and overhaul; access for printed circuit board central processing unit or component upgrade; dielectric side choices; battery cap type design for possible tight fit to components; crease-hinge-fold twin-side options for both a board shield and a form shield; new zero draft hinge fold options; isolation of hot integrated circuits, circuity, components or areas; common ground to metal bezel; added functional support features.

Depending on the printed circuit board, subassemblies and enclosure housing design and functions, a board shield and a form shield can address specific or entire shielding issues. Both a board shield and a form shield focus on shielding as close to the generated radiation sources as possible, unlike conventional enclosure housing shielding. Unlike typical conformal and add-on shielding, both a board shield and a form shield are 3-dimensional in their design, concept and use. Both address electromagnetic compliance issues and do not rely on the platform of the enclosure housing or an arbitrary design—they are 100% specific and unique in each and every case.

Thermoforming of a Board Shield and a Form Shield

In manufacturing a board shield and a form shield (thermoforming, pre-or post-metalization and cutting), each manufacturing step has aspects that are unique. Thermoforming items and process considerations are as follows: Thick or thin Films; use of specialty polycarbonate (PC) extruded films; polycarbonate film of 0.005 inch to 0.025 inch thickness; clear, black, texture; flatness after thermoforming; shrinkage in all 3 axes; structural function-support and rigidity; UL compliance; draw ratios-shallow or deep draw; complex 3 dimensional details and design; use with proprietary crease-hinge-fold or zero draft fold; ability for flex and bend; maintain shape and form during operating conditions; Draw down depth; film thickness determine depth of draw; film thickness determines amount of 3-D details; thermoforming conditions of tool, machine, film and time influence draw; consideration of shrink in X, Y and Z axes; Temperatures; polycarbonate board shield and form shield capability of maintaining form, fit and function to 275 F.°/135 C°.

Single Side versus Two-Side Board Shield and Form Shield

In a thermoformed metalized film, as in a 5-sided form shield, the addition and use of a proprietary hinge-fold zero draft fold allows for the completion of a sixth side being part of the continuous film and electrical continuity of a form shield to both sides of a printed circuit board with a continuity of a common ground plane. This can either replace two single-piece form shields or may be considered a wraparound seamless shielding design for a printed circuit board or electronics enclosure housing.

The design and strength of thin-film thermoformed polycarbonate and a flexible metalized surface allows for bend and flex to maintain common ground plane and shielding of the form shield or board shield and hence its novelty. Both become a true 3-dimensional electromagnetic compliance solution. The 5-side to 6-sided box idea (or two-piece to single piece form shield/board shield) around a printed circuit board may be done by using a proprietary crease-hinge-fold or a zero draft fold. This avoids the use of the standard crease-hinge-fold mechanism found in all fold-over thermoformed packaging. The sixth side concept for both a board shield and a form shield may be considered to eliminate conventional problems with seams and continuity inherent with shielding of a printed circuit board and enclosure housing design limitations. This sixth side allows the concept of full encapsulation in shielding a radiating device, independent of the enclosure, as an integrated circuit grouping on a printed circuit board or a printed circuit board, or the entire contents within an enclosure housing.

Both a form shield and a board shield can accommodate both box-lid, clamshell type, and open-ended bezel conventional enclosure housing designs. This allows greater freedom of printed circuit board and integrated circuit component placement design without regard to the enclosure housing design. A form shield and a board shield may need to have slits and portals cut for access doors, connectors, bays, and the like.

Cellular Phone 5 to 6-Sided Box

A two-sided form shield allows for encapsulation of both sides of a printed circuit board. When including form shield gasketing dots, the printed circuit board is completely shielded, except at the connector portals. A form shield or a board shield shielding of the printed circuit board may include side edge shielding. This prevents a slot or seam radiation problem. A form shield may be one or two pieces and a board shield may number from one to as many pieces as there are integrated circuits on the printed circuit boards.

The metalized surface of a board shield faces the metalized surface of a form shield and this may be in direct contact for a common ground. A board shield allows for isolation of individual integrated circuits and other printed circuit board components yet maintains common ground continuity without regard to limitations of the enclosure itself. A board shield is not required to be used in conjunction with a form shield. Depending on design, a board shield or a form shield may incorporate elements of added structural rigidity and strength. For both a board shield or a form shield, the added sixth side (or thought of as two-piece to single piece) may be of a winglet rather than a fully mating printed circuit board or enclosure housing side.

Notebook Computer 5 to 6-Sided Box

A note book computer form shield needs to take into consideration the central processing unit-base/keyboard cover access and portals. A form shield allows for added isolation of printed circuit board radiation to surrounding access bays and subcomponents through internal form shield wall placements.

A board shield used on the printed circuit board integrated circuits further allows more effective form shield use through more localized electromagnetic compliance shielding at the radiated sources on the printed circuit board. Sophisticated design and integration of a board shield to a form shield yields a true paradigm in shielding technology. A form shield allows printed circuit board side edge shielding of various printed circuit boards of the notebook and may be of winglet type or encapsulation of one printed circuit board from another.

A form shield or a board shield allows notebook computer printed circuit boards to have integrated circuit or component compartment isolation, further increasing printed circuit board performance while reducing electromagnetic compliance issues through using ground-trace paths as in cellular phone printed circuit boards. A form shield and possibly a board shield in notebook computers require addition of slits and doors for internal access while maintaining shielding and common ground.

Electronic Enclosure 5 to 6-Sided Box

An electronic enclosure allows for a 5 to 6-sided box form shield with internal walls and structures to add in shielding or removal of additive conductive gaskets. Addition of larger form shield gasketing dots is usable for common ground plane and electromagnetic compliance seam control on metal frames. A form shield and a board shield allow for shielding closest to source and do not hinder air flow through fan cooled systems. A form shield can be perforated to attain better cooling air flow capability needed on enclosure housings. A form shield can add zippers for "punch-out" for optional access, tear-away bay or portal sections. Deep or shallow thermoforming is available for a form shield or a board shield.

Printed Circuit Board 5 to 6-Sided Box

A form shield and a board shield allow closest printed circuit board source shielding. Both allow a printed circuit board manufacturer to supply an as-shielded board. Both allow full or specific shielding encapsulation of a printed circuit board and accommodate heat sink/heat pipes integration. Use of a board shield and a form shield may avoid problems involving radiation being reflected by other metalized surfaces as in sheet metal, foils or conformal shielding into other areas of enclosure housing and subsequently out portals or seams (fresnel lens type problem).

Printed Circuit Board Integrated Circuit Components Isolation by 5 to 6-Sided Box A board shield may be directly incorporated into a form shield in certain cases, which then allows true two-sided printed circuit board shielding, integrated circuit isolation by one element, and metal-can integrated circuit printed circuit board level replacement or assistance.

Thermoforming and Proprietary Hinge-Fold/Zero-Draft Fold 5 to 6-Sided Box

A form shield and a board shield thermoforming design can create a 3-dimension 5-sided box. Incorporating into the form shield or board shield thermoforming design a proprietary crease-hinge-fold mechanisms can make a self containing 6-sided box from a variety of thermoformable polymers. This can also be thought of as a two-sided single piece form shield or board shield. The use of extruded thin-film polycarbonate is preferred as the choice for a form shield and the proprietary hinge-fold mechanism because conventional thermoforming polymers lack structural integrity and operational conditions of precision and temperature limits to allow them to be used as a form shield or board shield. More importantly, conventional conformal shielding technologies do not bend or stretch to allow being flexible and bendable in a folding-elongating environment. These technologies are not meant for elongation during flexing and stretching of a film.

Metallic coatings technology combined with proprietary design, tooling and implementation allow creation of a sixth side that maintains electrical common ground continuity and enables shielding to be accomplished without traditional seam or gap problems on a 5 side-to sixth side configuration. A form shield or a board shield can encapsulate a printed circuit board or enclosure housing and be a seamless integrated electromagnetic compliance shield.

Varying Dielectric Side Use

For both a form shield and a board shield, the metalized side can be interchanged between either side of the thermoformed film, depending on the intended use. This may entail a metalized side facing the printed circuit board as in a form shield and form shield gasketing dots for cellular phone printed circuit board, or facing away from the electronics as in a board shield for use directly on integrated circuits or a printed circuit board. Neither conformal shielding technology of enclosure housings or sheet metals have this capability.

Cellular Phone

Isolation of radiating integrated circuits and groupings of integrated circuits on a printed circuit board simply cannot be accomplished by shielding of an enclosure housing. A board shield allows radio frequency isolation and common ground of radiating integrated circuit components at the source, on the printed circuit board itself.

A board shield can be used in conjunction with a form shield in isolating the radiating printed circuit board emissions independent of the enclosure housing and meeting electromagnetic compliance regulations. In some cases a board shield may be an actual part of a form shield in its design, manufacture and use. Both a board shield and a form shield can be conformally matched to the integrated circuits or printed circuit board unlike an enclosure housing conformal shielding and conventional add-on shielding technology of sheet metal or foils. This allows for greatest localization of a shield, least dimensional change and closest common ground.

A board shield and a form shield can utilize the proprietary crease-hinge-fold mechanism to be a single or two piece electromagnetic compliance solution, encapsulating the radiating source, including printed circuit board edges. Use of form shield gasketing dots allows direct isolation of printed circuit board compartments without the use of added conductive gaskets or metal clips. This also allows for a seamless and continuous shielding and common ground path.

Notebook Computers

A form shield can actively use added internal walls to aid its shielding of portals and access bays from the central processing unit or printed circuit board. These added internal walls are designed around the sub-components of the bays, such as batteries, CD-ROMs, PCA cards, and the like. Some sub-components are hot-swappable, meaning they are swapped with the computer while it is operating and need a common ground to the printed circuit board. The use of multiple motherboards and daughterboards may still facilitate the use of one or two form shields in total, rather than printed circuit boards. Central processing unit heat sinks or heat pipes for central processing unit cooling may be outside of the form shield-printed circuit board envelope. A form shield and a board shield may have the dielectric side facing the electronics and may mirror-image the integrated circuits and printed circuit board. A form shield and a board shield readily address Sweden's TCO-99 recycling regulation whereas conformal shielding is non-compliant.

A form shield for a notebook computer may also require shielding of the color LCD display screen. If at least 3 of the 4 piece enclosure housing sections require shielding, at least two form shields are required—one for the central processing unit-keyboard base and one for the LCD screen and attached control printed circuit board hardware. A board shield may be used for the LCD color screen printed circuit board integrated circuit components. A form shield may provide common ground to printed circuit board hardware and or the rear metal bezel. A form shield and a board shield create a smaller 3-dimensional electromagnetic compliance shield footprint than shielding of an enclosure housing.

A form shield and a board shield can address elements of a printed circuit board or enclosure with more problematic radio frequency interference areas and by design and manufacture, provide increasing electromagnetic compliance protection. This can be accomplished by added walls, closer common ground, breakup pattern design such as accordion sleeve type surface area.

Electronic Enclosures

In a large electronics enclosure such as a laboratory analytical device or multiple bay back-up drives, there may be multiple radio frequency interference sources from printed circuit boards, harnesses and sub-components may facilitate a form shield design to encapsulate the interior of the enclosure housing, rather than focus on integrated circuits and printed circuit board radiating sources. There may be a metal frame assembly required, common ground, and form shield gasketing dots or a secondary added conductive common ground path such as conductive adhesive tape or wire mesh contact.

There may be a magnesium metal enclosure rather than molded polymer and rigid demands for protection of corrosion of magnesium do not yield a common ground plane or shielding option. The magnesium must be plated for both corrosion and electromagnetic compliance value. A form shield allows for corrosion protection of magnesium while maintaining electromagnetic compliance protection. A sheet metal shroud may be used not only for electromagnetic compliance but for support structure as well. A form shield can also be designed for similar support and strength.

Printed Circuit Board Components

Shielding of printed circuit board components is not enclosure housing shielding. A form shield and a board shield may directly address printed circuit board and integrated circuit or integrated circuit components shielding. Integrated circuits and integrated circuit groups may be isolated and selectively shielded by a board shield. This may replace metal cans referred to as "board or component level shielding", the purpose being to isolate an integrated circuit from the rest of the printed circuit board population.

A Board Shield and a Form Shield Delivered Metalized Film

Both a board shield and a form shield require at least one metalized film surface. The characteristics of the metalization, film and thermoformed results have a synergistic, unique and seamless electromagnetic compliance quality, resulting in a novel board shield or a form shield. Conventional methods of metalizing a film or a film-like quality for thermoforming are inadequate.

Conventional Metalizing Methods

Vacuum plating of aluminum and other physical vapor depositions of metals, a somewhat limited shielding of enclosures, may fail due to or one or more of the following shortcomings: polycarbonate films or aluminum films micro crack and warp and are non-ductle (do not elongate), non-bendable, non-flexible (exhibit cracking), non-thermoformable, oxidation prone (electromagnetic compliance failure), and fails to maintain electrical continuity or adhesion when folded, bent or elongated. Plating on plastics is generally used on shielding enclosure housing and fails due to one or more of the following short-comings: warping of a film, non-ductile, non-bendable, non-flexible, non-thermoformable, poor adhesion (blistering), and fails to maintain electrical continuity or adhesion when folded, bent or elongated. Laminated metalizing methods, metal foils used in localized electromagnetic compliance issues, fail due to one or more of the following short-comings: non-ductile, non-flexible, non-bendable, non-thermoformable, and fail to maintain electrical continuity or adhesion when elongated or used for 3 dimensional use. Woven and coated fibers, generally little used in electromagnetic compliance, fail due to one or more of the following short-comings: limited ductility, non thermoformable, mechanically unstable for 3-dimensional use. Conductive metal bearing paints, generally used on shielding enclosure housings, may fail due to one or more of the following short-comings: stress-anneal deformation, polycarbonate films are non-ductle, non-flexible, non-thermoformable or fail to maintain electrical continuity or adhesion when folded, bent or elongated.

Pre- or Post-Thermoforming Metalization of a Board Shield and a Form Shield

Metalizing for a board shield and a form shield may be done either prior to or following the thermoforming process. There are advantages and disadvantages to either pre- or post-metalizing to thermoforming. Vacuum metalization, if successful at all, as a method of shielding on a form shield or a board shield may only be done following thermoforming.

Pre-Thermoforming Metalization

Both a board shield and a form shield may be metalized with a conductive metal bearing paint prior to thermoforming. The metalized film maintains adhesion, continuity and all structural and electrical properties both before and after thermoforming on a variety of thermoformable extruded polymer films such as polycarbonate, acrylic, polyethylene terephthalate glycol (PETG), polyvinyl chloride, styrene and polyester.

During thermoforming, the percent elongation (stretching) of the film during web (film) sag and draw down onto the thermoforming tool translates to an equivalent elongation or stretching of the metalized film. Continuity of ground plane, conductivity and mechanical properties of the elongated metalization are maintained, without tearing or cracking. The conductivity changes due to a thinner metalization on elongated sections of the thermoformed board shield or form shield and correlates to equivalent conductivity at those known metalization dry film builds. A board shield and a form shield depth of draw (elongation) during thermoforming determine the minimum amount of metalization required in conjunction with electromagnetic compliance desired properties.

Metalization with a conductive metal bearing paint is done by one of 5 methods in pre-thermoforming metalization: spraying, curtain coating, roll coating, silk screening, or pad printing. When spraying by conventional or high volume low pressure guns, the polymer film is sprayed to a specific wet film thickness state and then accelerated dry to result in a specific metalized dry film thickness prior to thermoforming. When curtain coating, the web is traversed through a fluid overflowing curtain of metalizing film at a specific rate of speed and metalized wet film technical characteristics to result in a specific metalized dry film thickness, which is then accelerated dry to result in a specific metalized dry film thickness prior to thermoforming. When roll coating, a roller applies to the web, on a continuous basis, which is being replenished at a specific rate, metalized wet film of chosen technical characteristics to result in a specific metalized dry film thickness whic is then accelerated dry to result in a specific metalized dry film thickness prior to thermoforming. When silk screening, the web is brought into direct contact with a screen and a wet film is applied by a variety of screening transfer methods to result in a metalized wet film which is then dried to result in a specific metalized dry film thickness prior to thermoforming. When pad printing, a metalized ink is applied through a cliche and is transferred by a pad to the web, then dried to a specific metalized dry film thickness prior to thermoforming.

Post-Thermoforming Metalization

Once thermoformed, a board shield and a form shield are now 5-sided boxes to be metalized. Metalization may be done by either spraying, pad printing, or curtain coating, as set out above for pre-thermoformed metalization. Care has to be taken in fully metalizing the vertical sections of the thermoformed plastic as well as complex details or geometries in the thermoformed a board shields or a form shields.

Features and Benefits of Metalization Film Characteristics

Metal polymers such as stabilized non-oxidizing copper, silver or any combinations thereof result in electromagnetic compliance choices for a board shield or a form shield. The degree of metalization (dry film build) determines the metal choice. Polymer and liquid vehicle chemistry allow a metalization vehicle (metal-loaded liquid coating) with unique characteristics of stability, flex, bendability and conductivity to be used on thin-film extruded polycarbonate without detrimental effects in the physical manufacturing and delivery of a board shield or a form shield. The metalized film final sheet or surface-volume resistance (in point-to-point ohms measurement or ohms-per-square) can be varied by either metalization choice or final dry film thickness.

A board shield or a form shield can have varying resistance of the metalized film, either greater or lesser, to accommodate specific electromagnetic compliance or ground-plane needs. This is readily accomplished through the present metalization technique but is difficult at best on other conventional technologies. In vacuum metalization, for example, the level of metal deposited is uniform, while a metal-loaded liquid coating may be applied in different film thicknesses as required. Lower resistance (lower ohms when measured) results in higher shielding effectiveness of a board shield and a form shield. Both a board shield and a form shield may not only have varying areas of resistivity, but areas of the thermoformed part may be selectively masked resulting in selective areas of metalization. Such is not the case for all additive technologies. It is also possible to metalize both sides of a board shield or a form shield.

Both a board shield and a form shield allow for fully flexing and bending of the substrate in all 3 axes as a thin film polymer without tearing, shearing, blistering or any loss of metalizing film adhesion or electrical continuity. No conformal technology or metallic foil, sheet metal or laminates can do this. Both a board shield and a form shield may be thermoformed in a pre-metalized state, and maintain electrical and physical characteristics. No other technology can do this. A vacuum metalized form shield, for example, will exhibit cracking and loss of electrical continuity or adhesion if thermoformed after metalization. Specifically extruded polycarbonate film yields the best physical and operating characteristics for a board shield and a form shield. As such, the metalizing technology has been formulated specifically to be used on thin-film polycarbonate without problems of warping, cracking, curling, adhesion, loss of tensile strength, loss of sheer strength or other physical detriment. Thin film polycarbonate of 0.005 inch to 0.025 inch yield a board shield and a form shield physical and detail characteristics under proprietary and unique thermoform tooling and thermoforming conditions, either pre- or post-metalized.

One to Two-sided Board Shield and Form Shield

Through proprietary use of a unique crease-hinge-fold mechanism, yielding a unique zero-draft fold, a design can be created, tooled and manufactured that results in thin-film polycarbonate being folded over onto itself to make a 5 to 6-sided box, without cracking or physical failure. In addition, metalization technology allows for elongation of the metalized film in the fold and maintains electrical continuity of ground and resistivity, without cracking, or adhesion failure. These both represent proprietary unique technologies.

A board shield and a form shield are usable from $-50°$ C. to $135°$ C. A board shield and a form shield may have dielectric (non-metalized) sides facing to or away from electronics based on the need at hand. This is typically not possible with an conformal or additive shielding unless dielectric films are separately attached.

Form Shield Gasketing Dots

A form shield directly incorporates form shield gasketing dots to allow a specific integrated form shield gasket path along the ground trace of a printed circuit board (0.5 to 1 inch wide gold plated line path). This allows for complete isolation or containment on a printed circuit board. Multiple printed circuit board isolated compartments can be incorporated on the printed circuit board, within reasonable physical dimensional limitations and be shielded and isolated by a single form shield. The form shield gasketing dots maintain consistent contact to the printed circuit board ground trace. The form shield gasketing dots make a positive and constant pressure contact along the ground trace path of a printed circuit board and may have varying degrees of pressure contact force, dimensions and pitch, that is closeness of each form shield gasketing dot. Form shield gasketing dots replace secondary added metal filled flexible gaskets or metal mechanical clips as a means of maintaining a conductive seal of the gap between the printed circuit board and a metalized molded-in internal wall of an enclosure matching the printed circuit board ground plane trace. Unlike conventional conductive gasketing methods, integrated form shield and form shield gasketing dots are one-in-the-same, being designed in and offering a continuous uninterrupted electrical path to the printed circuit board ground trace.

Form shield gasketing dots may use the enclosure housings internal matching vertical walls for gasketing dot base support to the printed circuit board ground trace, or contact pressure can be designed in from the form shield itself without the use of a supporting enclosure housing wall using the polycarbonate film. As noted above, form shield gasketing dots may be varied as to: dot height above a form shield film; dot pitch (distance between dots); dot diameter; dot film thickness; dot-to-printed circuit board ground trace contact point. These multiple parameters allow for adjustment of the form shield gasketing dots to vary: dot contact pressure; dot-to-printed circuit board ground trace surface contact area; dot-printed circuit board-to-housing fastener closure force (cellular phones); GHz frequencies (1-20 GHz); height of printed circuit board above enclosure boss or insert; dot-to-printed circuit board ground trace resistivity; dot life-cycle capability.

Form shield gasketing dots tested by 100% compression to 50+ cycles, exhibit no physical damage to form and fit of the gasketing dot and no loss of metalized resistivity or electrical continuity of the gasketing dot to the form shield.

Proprietary Crease-Hinge-Fold and Zero-Draft Fold for Single to Two-Sided Form Shields and Board Shields There are two designs for allowing a form shield and a board shield to be used in a single two-sided manner, crease/hinge/fold and zero-draft fold. A crease/hinge/fold design is where a crease and accompanying hinge are designed into the thermoforming to allow up to a 360 degree bend by design, with 90 or 180 degrees being generally used. The hinge mechanism is of a teardrop shape which becomes the bending and elongating moving edge portion of the fold. The entire length or width of a board shield or a form shield may be used for the crease-hinge-fold, or just sections alone for physical and common ground continuity. A zero-draft fold design involves a small but finite crease designed onto a small hinge, with 4 small edge or starting cuts or slits placed on each quadrant parallel to the creased-hinge. Design of the crease and die cutting blade drafts influence the direction and strength of this fold. Both the crease/hinge/fold and zero-draft fold allow for a board shield and a form shield to be folded up to 270 degrees.

Metalizing technology allows for continuity of a common ground plane and depending on design, a single piece twin-sided board shield or a form shield through the use of either fold design mechanism. The use of thin-film polycarbonate allows for use in an environment of higher operating temperatures required by electronics manufacturers (up to 85 C.°) as well as UL certification when required. Depending on the fold design and placement, a one piece seamless electromagnetic compliance folded 6-sided configuration may be accomplished.

Features and Benefits

Overall, a form shield and a board shield have the following benefits: allow for single piece two-sided board shield and form shield; better electromagnetic compliance protection; lower costs and manufacturing complications; replace a multitude of add-on sheet metal or foils and conductive gaskets or adhesives; allow for continuity of a common ground plane to the reverse side of a printed circuit board or sub-component; aid in a seamless electromagnetic compliance design as well as remove form-fit electromagnetic compliance and common grounding problems with an enclosure housing and associated add-on conductive gaskets or adhesives.

For notebook computers, a form shield and a board shield have the following benefits: allow for form shield winglets to be added to shield portals and access bays from radiated emissions from printed circuit boards or associated hardware connections to the printed circuit board; open access bays for CD-ROMs, PCA cards and batteries are difficult areas for significant radiation leakage and electromagnetic compliance solutions to this are sheet-metal or foils added late in the design or manufacturing process while form shield winglets provide a solution to this electromagnetic compliance problem; allow for both sides of central processing unit placement to be shielded on the printed circuit board motherboard; the central processing unit generally is radiating on the reverse side of the printed circuit board and this further aids in electromagnetic compliance; allow for common ground for hot swappable component switching; allow a ready ground-point to electronic hardware for both ESD and common ground when a computer is operating; and avoid additional sheet metal and its attachment hardware and complications.

For electronic enclosures, a form shield and a board shield have the following benefits: allow for winglet to be reversed onto itself to place dielectric side over metalized size of a form shield or a board shield rather than adding and attaching a separate dielectric to the metalized side; allow for shielding of front or rear bezels (ends or front/rears of some enclosure housings) as an integrated part of the enclosure or printed circuit board shielding.

For printed circuit board and integrated circuit components, a form shield and a board shield have the following benefits: allow for edge of printed circuit board shielding; generally the side of the printed circuit board with the greatest emitting radiation or integrated circuit population receives the folded portion of a form shield or a board shield; allow for shielding of multiple printed circuit boards at varying heights; allow for electromagnetic compliance isolation between the printed circuit boards and their radiated emissions as well as provides for common ground and component isolation; allow for dielectric placement directly against integrated circuit components, this is where a form shield can be used as a board shield by folding onto itself and creating a board shield under conditions where in-designed board shield/form shield is either impractical, design or manufacturing limited.

Die Cutting and Trimming of a Board Shield and a Form Shield

As the final manufacturing step, the form shields and board shields need to be cut from the metalized and thermoformed sheets. In a conventional fashion, this involves the use of a steel rule die or matched-metal dies, both aligned and oriented to correctly position, cut and trim the form shields and board shields into individual components. Die cutting involves a horizontally placed cutting tool, with the cutting blades facing upwards and the object to be cut is positioned and aligned above the cutting tool and a pressure plate (100+ tons) is lowered to horizontal cut and separate the component from the sheet or web.

A steel rule die involves a steel ribbon of specific hardness, sharpened on one end of the ribbon, with specific blade taper or cutting tip properties, imbedded or shimmed into a matching laser cut baseboard with blade side facing upwards. The same CAD/CAM file used for a form shield and a board shield is used to generate the engineering and cutting format. A form shield or a board shield film is located or indexed onto the surface of the cutter, and located with the matched location details of the cutting tool. A pressure plate is lowered (100+ tons) and the film is cut and the finished form shield or board shield is removed, checked, lot marked and packaged for shipment.

With a match-metal die, the operating procedure is essentially the same as with steel rule dies, except that a precision machined and matched male and female paired tool is built to the form shield or board shield CAD/CAM files. When cutting, the matching dies place the male cutting tool into the female cavity and the film is cut or sheared in a more expedient and precise fashion.

With either technology, horizontal holes are cut with spring-loaded self-clearing punches, which allow access to bosses or inserts in a form shield or a board shield. There are several business and technical reasons in choosing steel rule dies over match metal dies, but the overall result is the same, a finished form shield or a board shield, with a cut dimensional tolerance of 0.005 inch to 0.010 inch. It is required in a majority of the designs that edge holes or portals be available for exterior side access (open sided ports, bays, air vents, etc.), or external access as in single to twin-sided form shield or board shield. In traditional film cutting, it is not possible to cut vertical film surfaces, unless one rotates the base axis or cutting surfaces 90 degrees, which is both impractical and generally expensive. The present invention includes 2 and possibly 3 unique and novel means to allow vertical portals, holes and vents in a form shield and a board shield, either as single or twin-sided versions to be created.

Vertical Cutting

On an area desiring a vertical wall opening on a form shield or a board shield, in the thermoforming tool, along the horizontal part of the thermoform, a crease is created to aid in cutting on the horizontal surface. In addition, a "well" is created on all 3 sides, but outside the form shield or board shield proper, to allow the thermoforming at that point to both thin and weaken, allowing a shearing of the vertical film during horizontal cutting.

The cutting blades shear through the vertical film walls both crushing and cutting the vertical aspects of the film. The crease and "well" create the accelerated cutting aspect as opposed to merely crushing the vertical film. This results in a vertically cut wall using a horizontal cutting surface.

Partial Vertical Wall Cutting

In many form shield or board shield designs, a portion of a vertical wall hole is desired, as in a portal vent or connector slot, and a combination of thermoforming, hinge-fold technology and die cutting is used. The form shield or board shield is designed around a thermoform platform but the external vertical wall(s) or surfaces to be selectively cut are thought of as part of the crease-hinge-fold mechanism, either as single or twin sided item. The vertical wall requiring selective cutting remians in a horizontal plane during thermoforming. The selective holes or portals for the vertical wall(s) are cut at the same time the form shield or board shield is trimmed and removed from the web. The hinge-fold technology allows this wall(s) to be positioned vertically after selectively cutting the holes or portals.

5 or 6-Sided Box Design

In considering a 5-sided or 6-sided box design, it is possible to create a form shield from a horizontal flat surface with only crease-hinge-folding and die cutting, having all the vertical walls (and subsequent holes or portals) all left in the horizontal plane, selectively creasing, hinge-folding and die cutting, and then folding into 5 or 6-sided form shields. This is possible when the configuration is very much like a shoebox, of 5 or 6 sides and no internal details or altered surfaces. The novelty in this is that it requires both the proprietary hinge-fold mechanism as well as the proprietary metalization technology. The film must be metalized prior to crease-hinge-fold, Zero Draft Fold and die cutting.

The invention will be better understood from the following detailed description of the preferred embodiments taken in conjunction with the Figures, in which like elements are represented by like referenced numerals.

Figure 1:
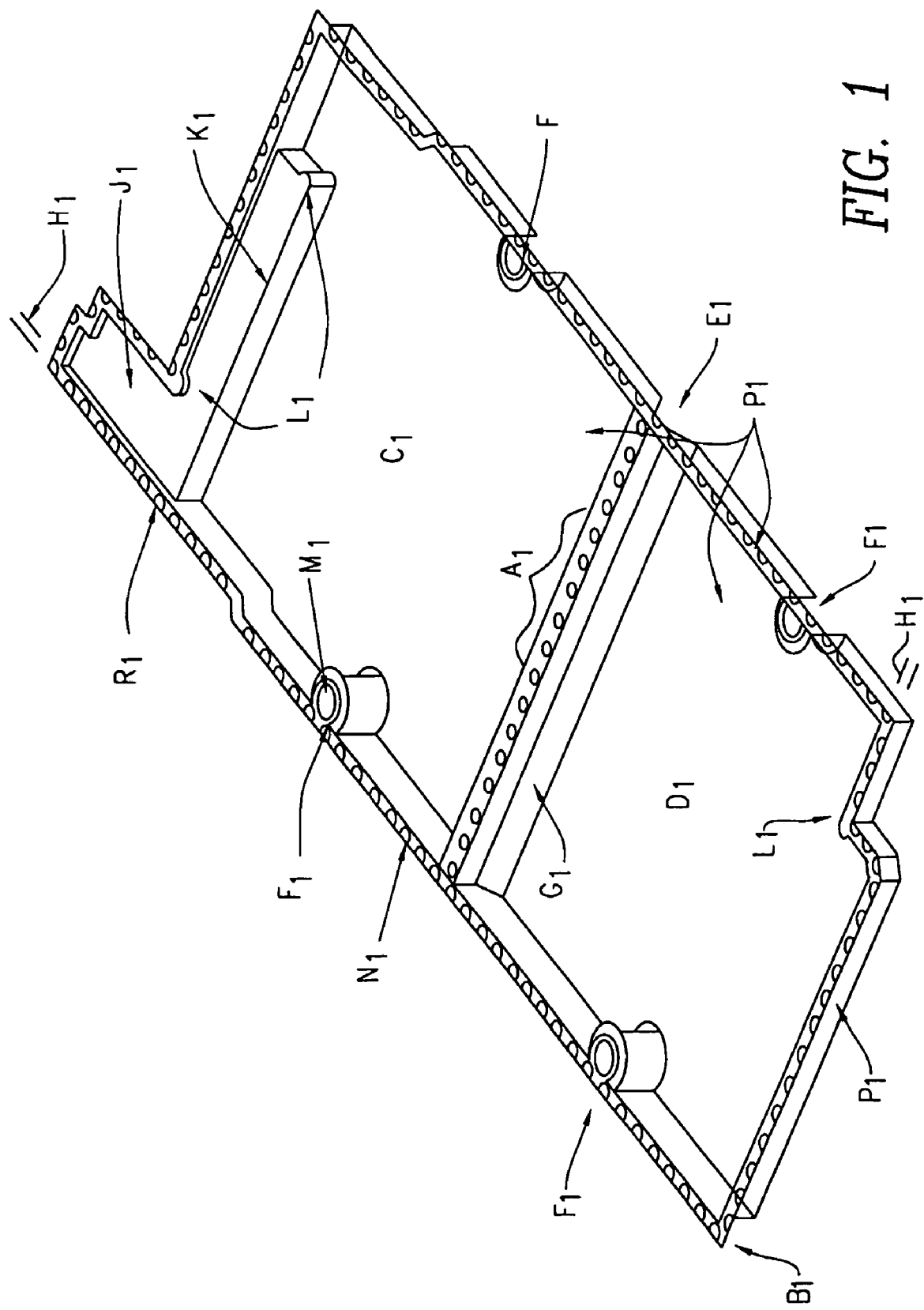

FIG. 1 illustrates a cellular phone single-side form shield for rear PCB and enclosure housing with two isolation chambers. The form shield is a mirror image of the rear enclosure housing since the original equipment manufacturer did not have PCB CAD/CAM file. The form shield has 4 boss holes and winglet tip (leg) with extreme close tolerance area and accompanying dielectric battery cap (not shown). A1 are form shield gasketing dots 0.100 inch pitch along 100% of PC ground trace. Gasketing dots are aligned to center of PCB ground trace. B1 is die cut to meet dimensions of the enclosure, with form shield gaskets cut on non-critical contacted or compression areas. C1 is isolated chamber C separate from chamber D. D1 is isolated chamber D separate from chamber C. E1 is separating form shield internal wall of chambers C and D. F1 is a raised boss detail extreme close tolerance. G1 a is internal form shield wall with draft for IC component tolerance and thermoforming tool release. H1 is a form shield gasket dot surface. J1 is extreme close tolerance area, IC proximity. K1 is an internal raised detail. L1 is thermoforming web continuity (non tear) detail points. M1 is a cut hole for assembly hardware. N1 is die cut tolerance +/−0.010 inch. P1 is the metalized surface, 100%, facing PCB. Q1 is the dielectric polycarbonate side. R1 is form shield thickness, 0.008 to 0.011 inch.

Figure 2:
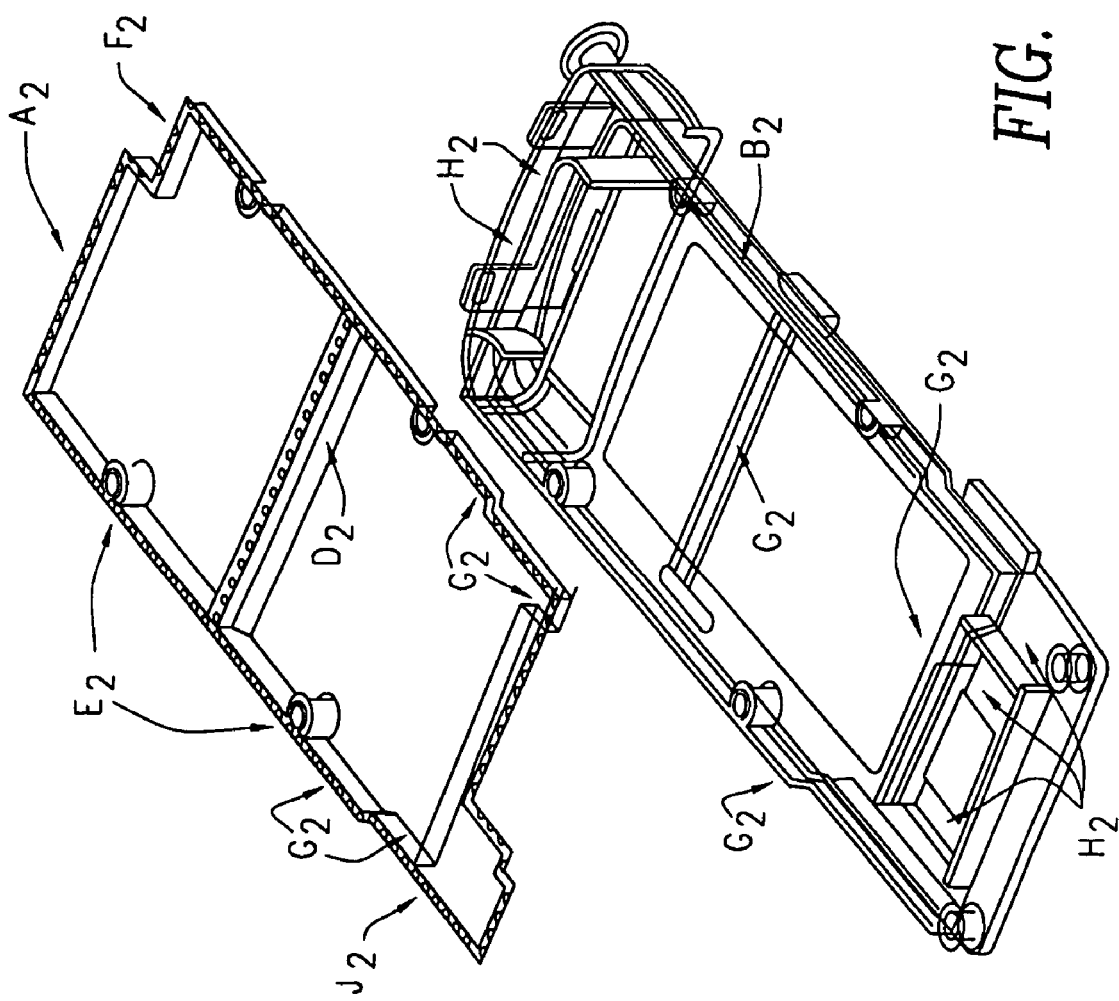

FIG. 2 illustrates a cellular phone single-side form shield for rear PCB and enclosure housing with two isolation chambers. FIG. 2 is an angled exploded view of a form shield above a cellular phone rear housing showing details of X-Y-Z axis of form shield to enclosure. The PCB goes against the form shield, facing down (rear of PCB). A2 are form shield gasketing dots 0.100 inch pitch along 100% of PC ground trace. Gasketing dots are aligned to the center of PCB trace. B2 is an enclosure housing internal wall which supports horizontal surface of form shield gasketing dots. C2 is an enclosure housing internal wall which supports form shield isolating chamber gasketing dots. Wall has slight in-molded crown from pre-form shield technology using conductive adhesive gaskets. D2 is a form shield internal wall with both sides having 2 degree bevel for thermoforming release and 45 degree bevel for PCB IC component clearance along entire isolating wall. Components may be within 0.5 mm of PCB ground trace and form shield. E2 are raised height dual beveled boss details with cut holes for assembly hardware (4). F2 is form shield isolation from antenna. G2 are form shield details matching enclosure rear housing. H2 is an area of rear enclosure housing devoid of form shield (matching PCB ground traces). J2 is extreme close tolerance to form shield area. K2 is isolating thermoformed battery cap (dielectric) not shown, as battery cap otherwise touches form shield.

Figure 3:
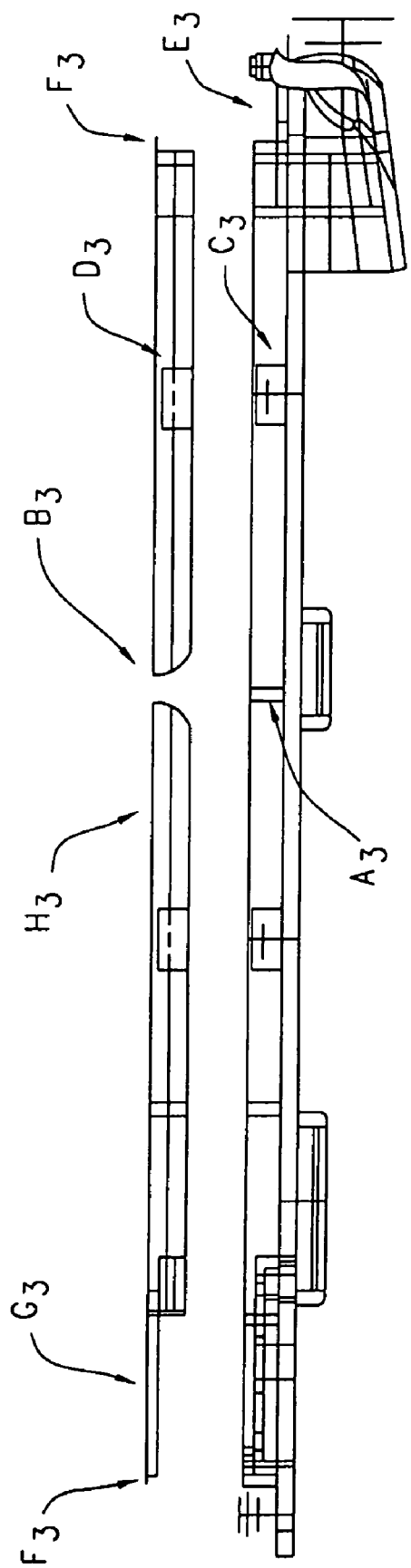
FIG. 3 illustrates a cellular phone single-side form shield and rear cellular phone enclosure housing, side views. Form shield gasketing dots are not shown.

FIG. 3 illustrates a cellular phone single-side form shield and rear cellular phone enclosure housing, side views. Form shield gasketing dots are not shown. A3 is an enclosure housing internal wall for chamber separation. B3 is a form shield internal wall with both sides having 2 degree bevel for thermoforming release and 45 degree bevel for PCB IC component clearance along entire isolation wall. Bridge between two chambers accommodates form shield gasket dots along width of PCB ground trace. C3 is an enclosure housing dual bevel boss for PCB support. D3 is a form shield matching detail to accommodate boss with accompanying hole for assembly hardware (4). E3 is enclosure housing details outside form shield-PCB EMC control area. F3 is form shield gasket dot platform. G3 is extreme close tolerance to form shield area. H3 is the metalized surface side of a form shield.

Figure 4:
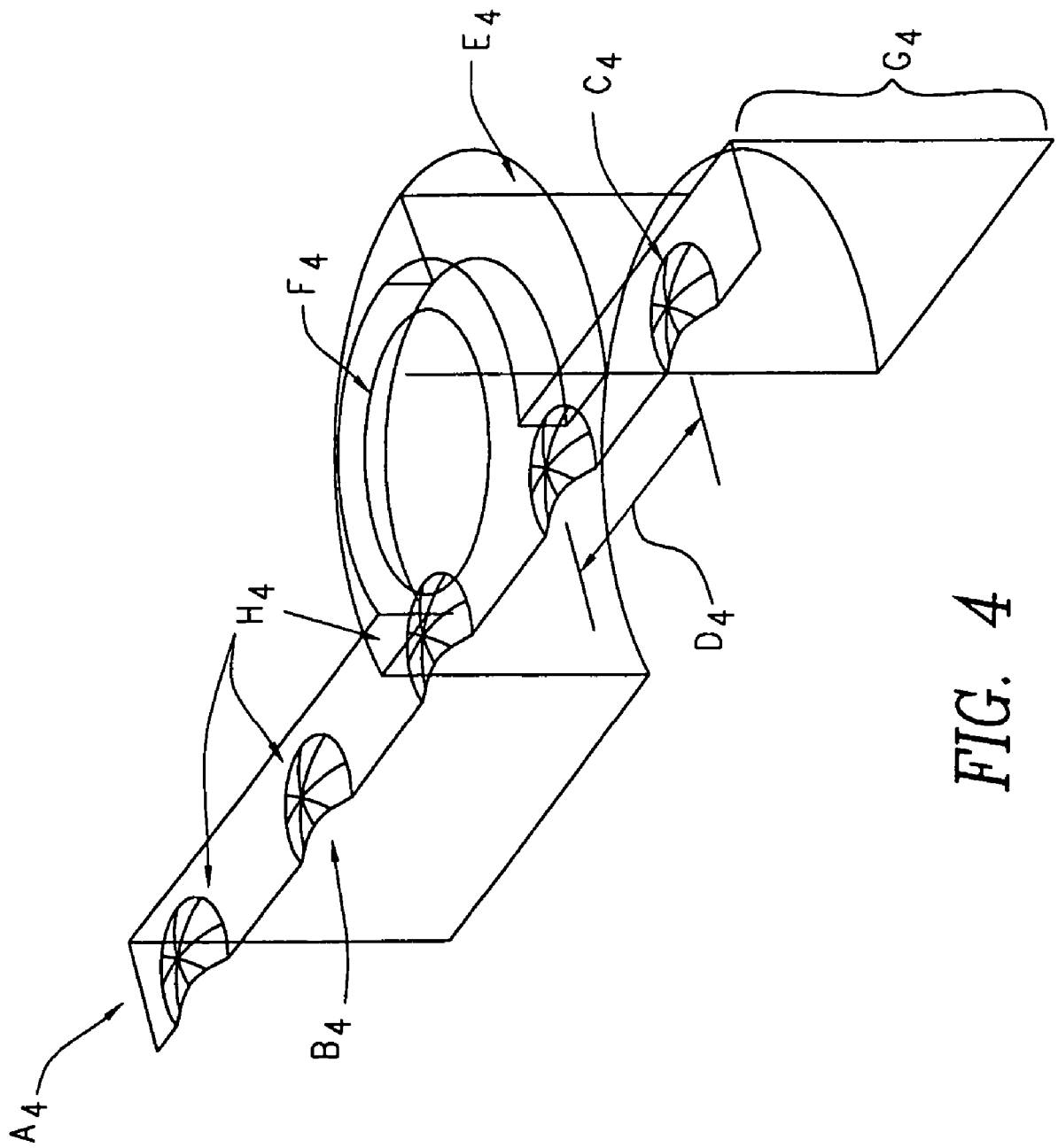
FIG. 4 illustrates form shield and form shield gasketing dots outside top angled view with accompanying verticals and boss-hole detail.

FIG. 4 illustrates a form shield and form shield gasketing dots outside top angled, view with accompanying verticals and boss-hole detail. A4 is a form shield gasketing dot section matting with PCB ground trace. B4 are form shield and form shield gasketing dots after final trimming and cutting. C4 is a form shield gasketing dot, shape, height and crown. D4 is a form shield gasketing dot pitch. E4 is a form shield boss detail. F4 is a form shield hardware attachment hole. G4 is a form shield vertical wall, matching enclosure rear housing. H4 are form shield gasketing dots integrated part of form shield.

Figure 5:
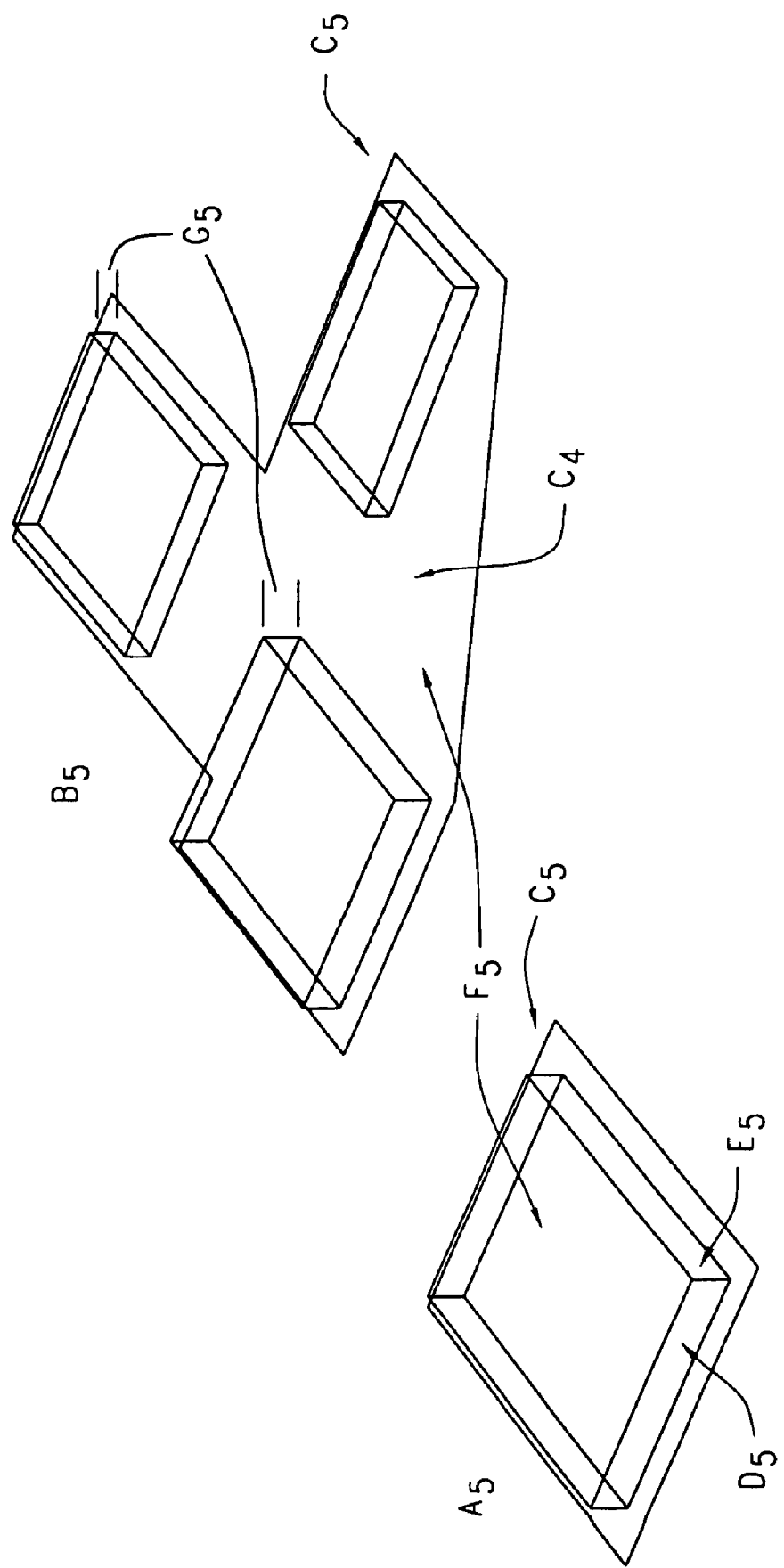
FIG. 5 illustrates a board shield for single integrated circuit (IC) and multiple ICs groupings shielding on a printed circuit board.

FIG. 5 illustrates a board shield for single IC and multiple ICs groupings shielding on a printed circuit board. A5 is an individual IC board shield. B5 is a board shield for a group of ICs. C5 are board shield wings covering IC, PCB lead connections. D5 is a board shield vertical wall which matches IC, but may be beveled away from IC at angles, such as a tent, anywhere along vertical axis. E5 is are board shield corners which may allow for compression fit. F5 is the metalized surface. G5 are board shields of varying heights to match IC component. H5 is a multiple IC components board shield tarp which may be flat or thermoformed to conform to PCB details.

Figure 6:
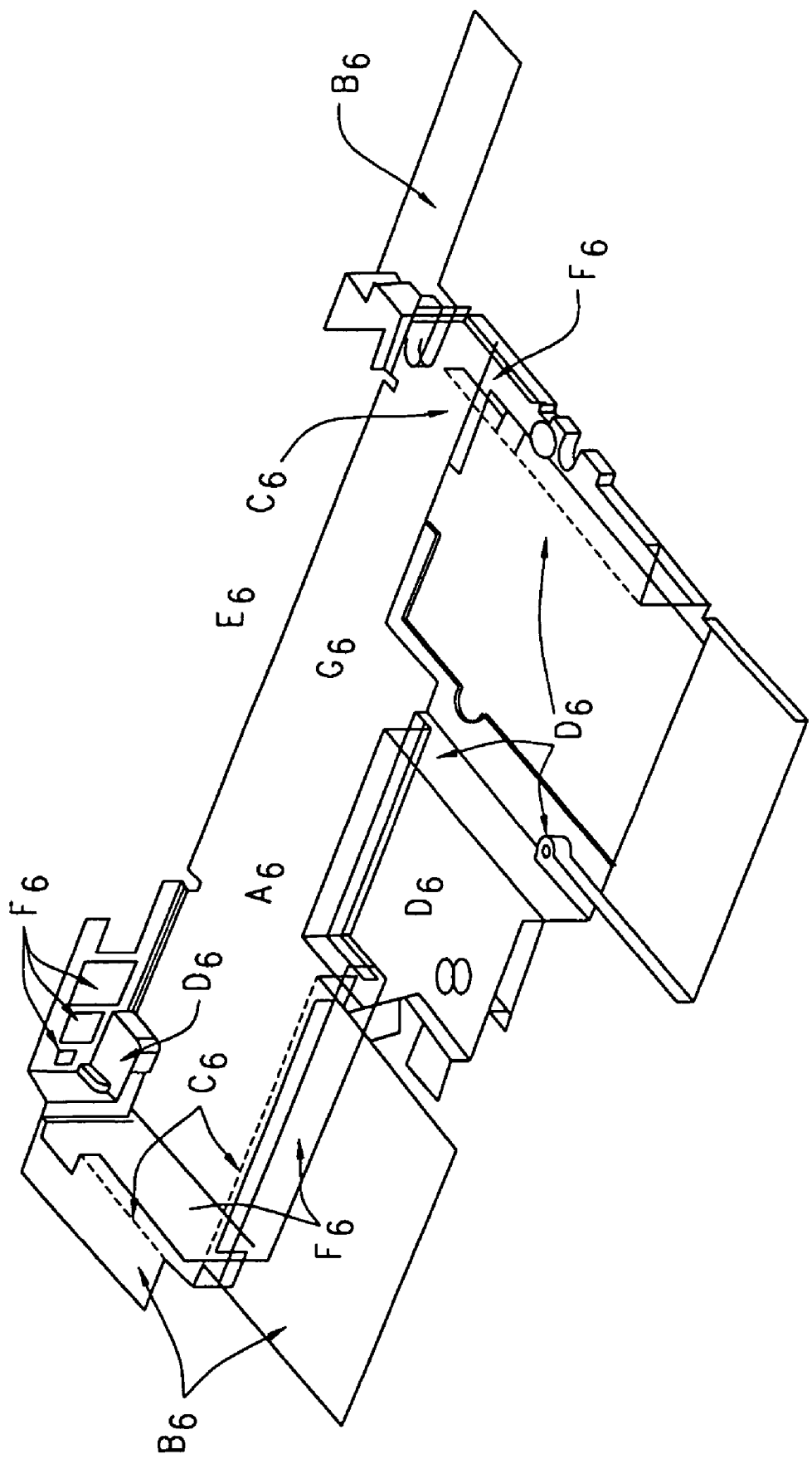
FIG. 6 illustrates a notebook computer, central processing unit (CPU) base and keyboard cover form shield with form shield fold-over winglets (3).

FIG. 6 illustrates a notebook computer, CPU base and keyboard cover form shield with form shield fold-over winglets (3). A6 is a form shield designed around a notebook CPU, keyboard base enclosure. B6 are form shield winglets (3) to be folded over 180 degrees on top of PCB and hardware. C6 are form shield crease-hinge-fold sections (3). D6 are form shield thermoformed details. E6 is the location of PCB-rear metal connector bezel. F6 are portals or holes. G6 is the metalized side.

FIG. 7 illustrates a notebook computer form shield for a CPU base-keyboard enclosure housing, done by crease-hinge-fold and cut method. This form shield uses no thermoforming in design, but yields a 5 and 6-sided enclosure by folding. A7 is a legend, back fold lines (folded back onto itself or reverse fold), fold lines and cut. B7 are portals or holes. C7 is a 3-sided slit for access to PCB. D7 is the dielectric side. E7 is a portal for PCA card. F7 are portals for connectors. G7 is a winglet cut out for 3-sided slit access once folded. H7 is a PCB metal bezel location. J7 is an open area for side external access.

FIG. 8 illustrates a notebook computer form shield for a CPU base-keyboard enclosure housing, done by the crease-hinge-fold and cut method, as shown in FIG. 7, shown in angled and partially folded position of 3 crease-hinge folds. A8 are form shield winglets partially folded (3). B8 is fold I. C8 is fold II. D8 is fold III. E8 is the direction of folds. F8 is a portal or access hole (3 dimensional). G8 is the metalized side. H8 is the location of a PCB motherboard. J8 is the location of subcomponents outside form shield. K8 are portals for connectors. L8 is a slit for form shield access for RAM chips.

FIG. 9 illustrates a crease-hinge-fold angled side view of a form shield or board shield winglet, elongated for display purposes, orientation as in thermoforming tool. A9 is a crease. B9 is a hinge mechanism. C9 is the fold direction. D9 is the metalized or dielectric side. E9 is edge definition, for diagram purpose only. F9 is the form shield (no details shown) for crease-hinge-fold for diagram purposes.

FIG. 10 is a crease-hinge-fold edge cross-sectional view of a form shield, board shield, or winglet shown in thermoformed position and prospective 180 and 270 degree fold-bends. A10 is an edge cross sectional view of form shield winglet. B10 is a crease. C10 is a hinge. D10 is a hinge, folding location (dotted line). E10 is a form shield, 180 degree bend (dotted line). F10 is a form shield, 270 degree bend (dotted line). G10 is a metalized side, either side.

The invention being thus described, it will be obvious that the same may be varied in many ways. Such variations are not to be regarded as a departure from the spirit and scope of the invention and all such modifications are intended to be included within the scope of the following claims.

I claim
1. A method for preparing a conforming shield enclosure for shielding a semiconductor device of an electronic component assembly comprising the steps of:
  (a) metalizing a sheet of a thermoformable polymer with an admixture of a conductive metal and a resin; wherein the conductive metal is selected from the group consisting of metalized thermoformable polymer comprises metal particles selected from the group consisting of copper, silver, cobalt, titanates, niobates, zirconates, nickel, gold, tin, aluminum, magnesium, and alloys thereof, and
  (b) thermoforming the metalized thermoformable polymer from step (a) to form a conforming shield enclosure;
wherein the conforming shield enclosure has dimensions conforming to the inside of a housing of the electronic component assembly and enclosing and thereby shielding the semiconductor device from electromagnetic frequencies, wherein the conforming shield enclosure is prepared by paint metalization, and further comprising the step of metalizing the conforming shield enclosure from step (b) with an admixture of a second conductive metal and a resin.

2. The method according to claim 1, wherein the thermoformable polymer is selected from the group consisting of polycarbonate, polyacrylate, polyethylene terephthalate glycol, polyvinyl chloride, styrene, polyester, and mixtures thereof.

3. The method according to claim 1, wherein the metalized thermoformable polymer comprises metal particles selected from the group consisting of iron, silver, nickel, ferrites, cobalt, chromium, magnesium, magnetic oxides, and alloys thereof.

4. The method according to claim 1, wherein the conforming shield enclosure further comprises integrated thermoforming gasketing dots to provide a positive and constant pressure contact along a ground trace path of a printed circuit board and a specific integrated gasket path along a ground trace of a printed circuit board.

5. The method according to claim 1, wherein the conforming shield enclosure encloses and shields the semiconductor device from electromagnetic frequencies and is attached by an adhesive or a conductive adhesive.

6. A method for preparing a conforming shield enclosure for shielding a semiconductor device of an electronic component assembly comprising the steps of:
  (a) thermoforming a sheet of a thermoformable polymer to form a conforming enclosure; and
  (b) metalizing the thermoformed polymer from step (a) with an admixture of a conductive metal and a resin to form a conforming shield enclosure;
wherein the conforming shield enclosure has dimensions conforming to the inside of a housing of the electronic component assembly and enclosing and thereby shielding the semiconductor device from electromagnetic frequencies, wherein the conforming shield enclosure is prepared by paint metalization.

7. The method according to claim 6, further comprising the step of metalizing the conforming shield enclosure from step (b) with an admixture of a second conductive metal and a resin.

8. The method according to claim 6, wherein the thermoformable polymer is selected from the group consisting of polycarbonate, polyacrylate, polyethylene terephthalate glycol, polyvinyl chloride, styrene, polyester, and mixtures thereof.

9. The method according to claim 6, wherein the metalized thermoformable polymer comprises metal particles selected from the group consisting of copper, silver, cobalt, titanates, niobates, zirconates, nickel, gold, tin, aluminum, magnesium, and alloys thereof.

10. The method according to claim 6, wherein the metalized thermoformable polymer comprises metal particles selected from the group consisting of iron, silver, nickel, ferrites, cobalt, chromium, magnesium, magnetic oxides, and alloys thereof.

11. The method according to claim 6, wherein the conforming shield enclosure further comprises integrated thermoforming gasketing dots to provide a positive and constant pressure contact along a ground trace path of a printed circuit board and a specific integrated gasket path along a ground trace of a printed circuit board.

12. The method according to claim 6, wherein the conforming shield enclosure encloses and shields the semiconductor device from electromagnetic frequencies and is attached by an adhesive or a conductive adhesive.

13. The method according to claim 1, wherein the electronic component assembly is a cellular phone.

14. The method according to claim 6, wherein the electronic component assembly is a cellular phone.

15. The method according to claim 2, wherein the thermoformable polymer is polycarbonate.

16. The method according to claim 8, wherein the thermoformable polymer is polycarbonate.

17. The method according to claim 1, wherein the metalized thermoformable polymer comprises copper particles, silver particles, or mixtures thereof.

18. The method according to claim 9, wherein the metalized thermoformable polymer comprises copper particles, silver particles, or mixtures thereof.

* * * * *